United States Patent
Kim et al.

(10) Patent No.: US 11,088,339 B2
(45) Date of Patent: Aug. 10, 2021

(54) ELECTROLUMINESCENT DISPLAY DEVICE

(71) Applicant: LG Display Co., Ltd., Seoul (KR)

(72) Inventors: Ho-Jin Kim, Paju-si (KR); SeungMin Baik, Paju-si (KR); JiYeon Park, Paju-si (KR); Sul Lee, Paju-si (KR); Sukhyeun Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/519,403

(22) Filed: Jul. 23, 2019

(65) Prior Publication Data

US 2020/0044177 A1 Feb. 6, 2020

(30) Foreign Application Priority Data

Jul. 31, 2018 (KR) .................. 10-2018-0089407
Jul. 11, 2019 (KR) .................. 10-2019-0084048

(51) Int. Cl.
*H01L 51/50* (2006.01)
*H01L 27/32* (2006.01)

(52) U.S. Cl.
CPC ...... *H01L 51/5044* (2013.01); *H01L 27/3206* (2013.01); *H01L 27/3246* (2013.01);
(Continued)

(58) Field of Classification Search
CPC .......... H01L 27/3206; H01L 27/3204; H01L 27/3211; H01L 27/3213; H01L 27/3225;
(Continued)

(56) References Cited

U.S. PATENT DOCUMENTS

2013/0228801 A1 9/2013 Lee
2015/0144906 A1* 5/2015 Ichikawa ............ H01L 51/5228
257/40
(Continued)

FOREIGN PATENT DOCUMENTS

CN 107068665 A 8/2017
GB 2570399 A 7/2019
(Continued)

OTHER PUBLICATIONS

Examination Report dated Aug. 17, 2020, issued in corresponding United Kingdom Patent Application No. 1910907.3.

*Primary Examiner* — Thanh Y. Tran
(74) *Attorney, Agent, or Firm* — Morgan, Lewis & Bockius LLP

(57) ABSTRACT

An electroluminescent display device includes: an electroluminescent display device, including: a substrate including: a first subpixel, and a second subpixel, a respective first electrode in each of the first subpixel and the second subpixel on the substrate, a trench in a boundary between the first subpixel and the second subpixel on the substrate, an emission layer on the first electrode, and in the first subpixel, the second subpixel, and the boundary between the first subpixel and the second subpixel, at least some of the emission layer being noncontiguous in the trench, a pore below the emission layer inside the trench, an upper end of the pore being relatively higher than at least some of the emission layer, and a second electrode on the emission layer.

22 Claims, 22 Drawing Sheets

(52) U.S. Cl.
CPC ........ *H01L 27/3248* (2013.01); *H01L 27/322* (2013.01); *H01L 2251/558* (2013.01)

(58) Field of Classification Search
CPC ............. H01L 27/3227; H01L 27/3246; H01L 27/3248; H01L 27/326; H01L 27/3262; H01L 51/5044; H01L 51/504; H01L 2251/558; H01L 27/322; H01L 27/3209; H01L 27/3258; H01L 33/08; H01L 51/5278; H01L 27/3244; H01L 51/50; H01L 51/5012; H01L 51/5206; H01L 51/5221; H01L 25/0753
See application file for complete search history.

(56) References Cited

U.S. PATENT DOCUMENTS

| | | | |
|---|---|---|---|
| 2017/0098686 A1* | 4/2017 | Jeong | ................... H01L 51/504 |
| 2019/0154902 A1 | 5/2019 | Maggiali et al. | |
| 2019/0280063 A1* | 9/2019 | Lee | ......................... H01L 51/56 |
| 2020/0020840 A1 | 1/2020 | Sheng et al. | |

FOREIGN PATENT DOCUMENTS

| | | |
|---|---|---|
| WO | 2017/221147 A1 | 12/2017 |
| WO | 2019/126675 A1 | 6/2019 |

* cited by examiner

ELECTROLUMINESCENT DISPLAY DEVICE

CROSS-REFERENCE TO RELATED APPLICATION(S)

This application claims the benefit of and priority to Korean Patent Applications No. 10-2018-0089407, filed on Jul. 31, 2018; and No. 10-2019-0084048, filed on Jul. 11, 2019; the entirety of each of which is hereby incorporated by reference.

BACKGROUND

1. Technical Field

The present disclosure relates to an electroluminescent display device, and more particularly, to an electroluminescent display device configured to emit white light.

2. Discussion of the Related Art

In an electroluminescent display device, an emission layer is provided between an anode electrode and a cathode electrode. The emission layer emits light by an electric field generated between the above two electrodes, to thereby display an image.

The emission layer may include an organic material that emits light when an exciton is produced by a bond of an electron and a hole, and the exciton falls to a ground state from an excited state. Alternatively, the emission layer may include an inorganic material, such as quantum dot.

The emission layer may emit different-colored light for each subpixel, for example, red light, green light, blue light, or white light for each subpixel, or may emit the same-colored light for each subpixel, for example, white light for each subpixel. If the emission layer emits different-colored light for each subpixel, a different-colored emission layer has to be deposited for each subpixel through the use of a predetermined mask. This has limitations because of the increase in the number of mask processes. Also, if a mask is not aligned precisely, it is difficult to accurately deposit the emission layer for each subpixel. In contrast, if the emission layer emits same-colored light for each subpixel, for example, white light for each subpixel, there is no need for a mask to pattern the emission layer, and any problem caused by a mask process is not generated.

However, in forming the emission layer configured to emit the same-colored light for each subpixel without the mask process, a leakage current may be generated due to a charge transfer through the emission layer between the neighboring subpixels. This may deteriorate picture quality.

SUMMARY

Accordingly, the present disclosure is directed to an electroluminescent display device that substantially obviates one or more of the issues due to limitations and disadvantages of the related art.

An aspect of the present disclosure is to provide an electroluminescent display device that prevents picture quality from being deteriorated by a leakage current.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: an electroluminescent display device, including: a substrate including: a first subpixel, and a second subpixel, a respective first electrode in each of the first subpixel and the second subpixel on the substrate, a trench in a boundary between the first subpixel and the second subpixel on the substrate, an emission layer on the first electrode, and in the first subpixel, the second subpixel, and the boundary between the first subpixel and the second subpixel, at least some of the emission layer being noncontiguous in the trench, a pore below the emission layer inside the trench, an upper end of the pore being relatively higher than at least some of the emission layer, and a second electrode on the emission layer.

In another aspect, there is provided an electroluminescent display device, including: an electroluminescent display device, including: a substrate including: a first subpixel, a second subpixel, and a third subpixel, a circuit device layer including a driving thin-film transistor respectively in each of the first, second, and third subpixels, a respective first electrode in each of the first, second, and third subpixels on the circuit device layer, a trench in respective boundaries between each of the first to third subpixels on the substrate, an emission layer on the first electrode, and in the first to third subpixels and the respective boundaries between each of the first to third subpixels, at least some of the emission layer being noncontiguous inside the trench, a pore below the emission layer inside the trench, an upper end of the pore being relatively higher than at least some of the emission layer, and a second electrode on the emission layer, wherein the first electrode in the first subpixel includes: a first lower electrode, and a first upper electrode, wherein the first electrode in the second subpixel includes: a second lower electrode, and a second upper electrode, and wherein the first electrode in the third subpixel includes: a third lower electrode, and a third upper electrode, wherein a distance between the first lower electrode and the first upper electrode, a distance between the second lower electrode and the second upper electrode, and a distance between the third lower electrode and the third upper electrode are different from one another.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

FIG. 17B is a cross-sectional view along line C-D o FIG. 17a.

Figure 1:
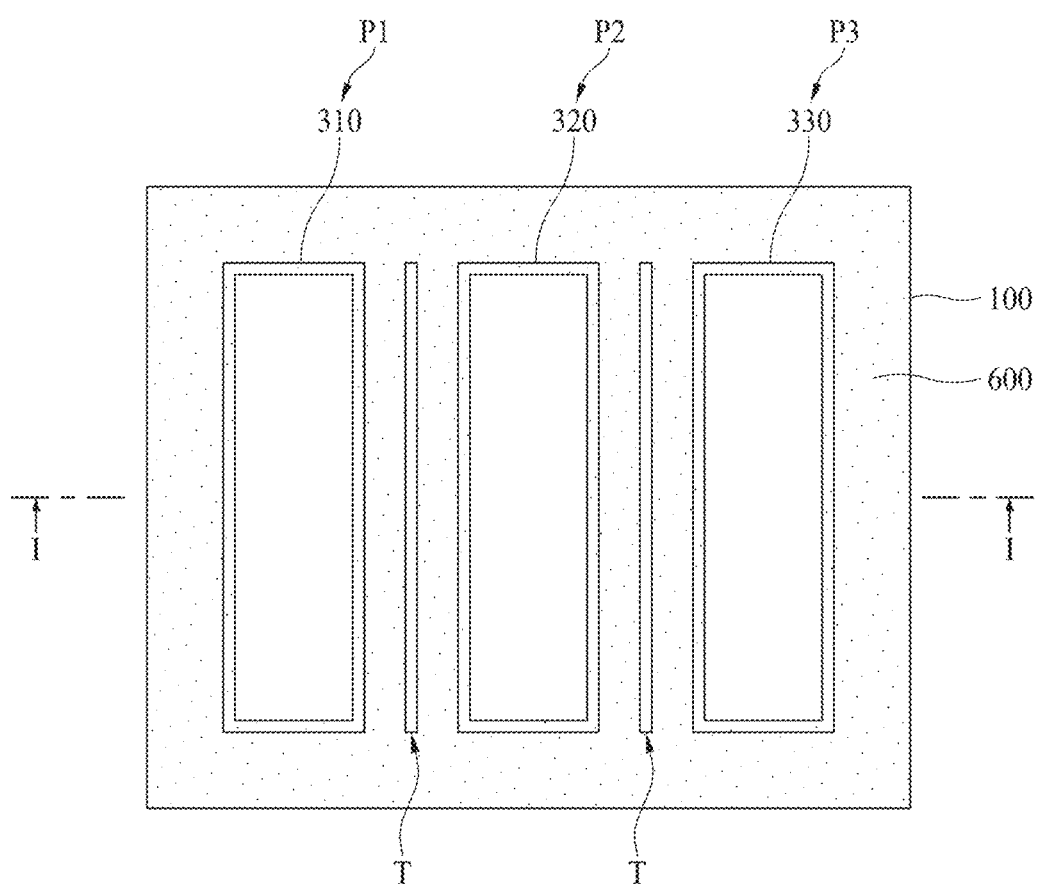
FIG. 1 is a plane view illustrating an electroluminescent display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an electroluminescent display device according to an embodiment of the present disclosure will be described in detail with reference to the accompanying drawings.

FIG. 1 is a plane view illustrating an electroluminescent display device according to an embodiment of the present disclosure.

As shown in the example of FIG. 1, the electroluminescent display device according to an embodiment of the present disclosure may include a substrate 100, a first electrode 310, 320, and 330, a bank 600, and a trench (T). A plurality of subpixels (P1, P2, P3) may be on the substrate 100. The plurality of subpixels (P1, P2, P3) may include a first subpixel (P1), a second subpixel (P2), and a third subpixel (P3).

The first electrode 310, 320, and 330 may be patterned for each individual subpixel (P1, P2, P3). For example, one first electrode 310 may be in the first subpixel (P1), another first electrode 320 may be in the second subpixel (P2), and another first electrode 330 may be in the third subpixel (P3). The first electrode 310, 320, and 330 may function as an anode of the electroluminescent display device.

The bank 600 may be formed as a matrix configuration in the respective boundaries between each of the plurality of subpixels (P1, P2, P3), and may cover the periphery of the first electrode 310, 320, and 330. For example, an exposed portion of the first electrode 310, 320, and 330, which may be exposed without being covered by the bank 600, may become an emission area.

The trench (T) may be in the boundary between each of the plurality of subpixels (P1, P2, P3). According to an embodiment of the present disclosure, the trench (T) may be provided such that some of an emission layer provided inside the trench (T) may be noncontiguous (e.g., disconnected or disconnectedly provided), to reduce or prevent a leakage current from being generated between the neighboring subpixels (P1, P2, P3). This will be described in detail with reference to the following cross-sectional structure.

Figure 2:
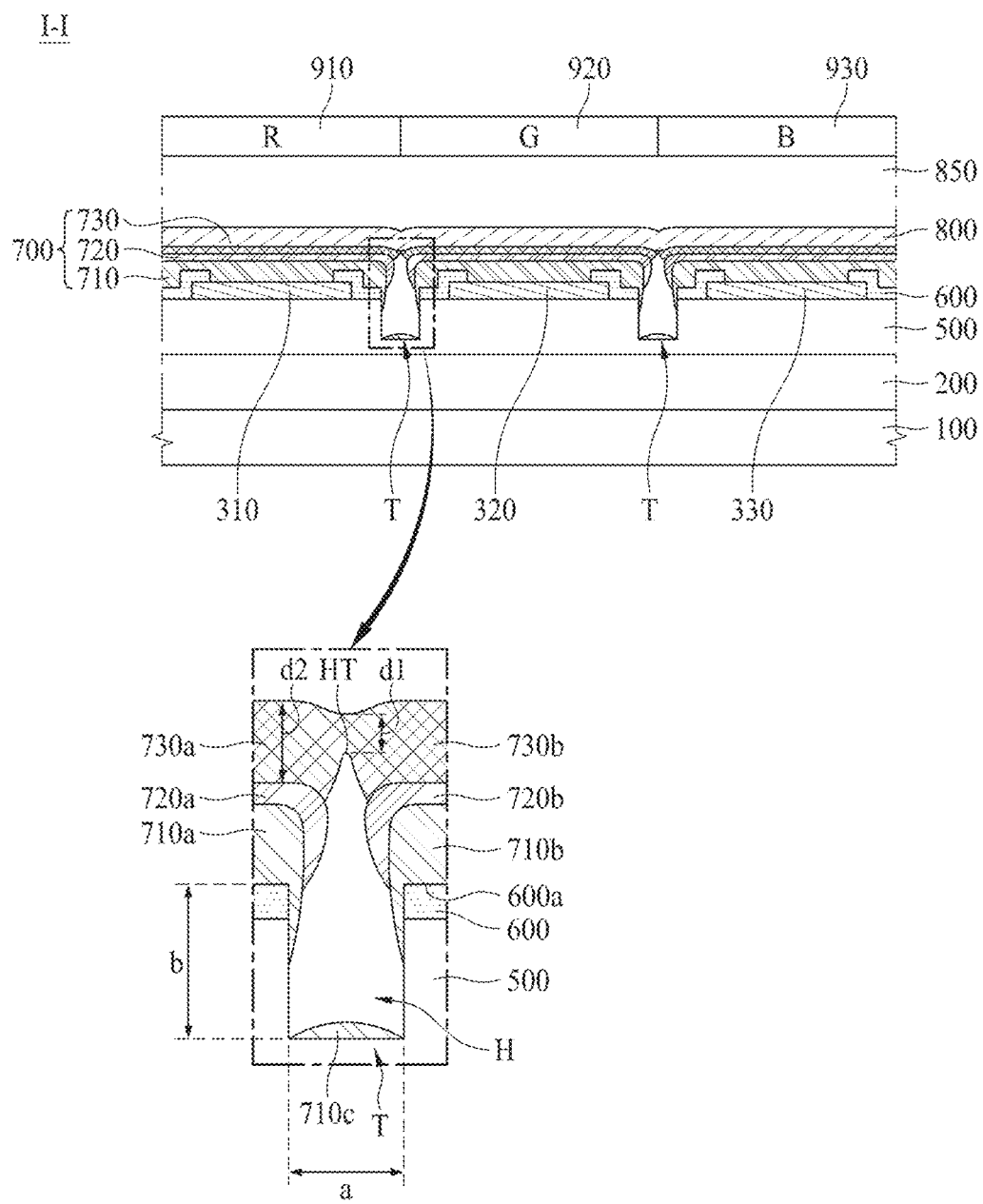
FIG. 2 is a cross-sectional view illustrating the electroluminescent display device according to an embodiment of the present disclosure, which corresponds to a cross-sectional view along line I-I of FIG. 1.

FIG. 2 is a cross-sectional view illustrating the electroluminescent display device according to an embodiment of the present disclosure, which corresponds to a cross-sectional view along line I-I of FIG. 1.

As shown in the example of FIG. 2, the electroluminescent display device according to an embodiment of the present disclosure may include the substrate 100, a circuit device layer 200, an insulating layer 500, the first electrode 310, 320, and 330, the bank 600, an emission layer 700, a second electrode 800, an encapsulation layer 850, and a color filter layer 910, 920, and 930. The substrate 100 may include glass or plastic, but embodiments are not limited to these materials. The substrate 100 may include a semiconductor material, such as a silicon wafer. The substrate 100 may include a transparent material or an opaque material. The first subpixel (P1), the second subpixel (P2), and the third subpixel (P3) may be on the substrate 100. The first subpixel (P1) may emit red (R) light, the second subpixel (P2) may emit green (G) light, and the third subpixel (P3) may emit blue (B) light, but embodiments are not limited to this structure.

The electroluminescent display device according to an embodiment of the present disclosure may be a top-emission type in which emitted light advances upwardly, but embodiments are not limited to this type. When the electroluminescent display device is formed in the top-emission type, the first substrate 100 may include an opaque material, as well as a transparent material.

The circuit device layer 200 may be on the substrate 100. In the circuit device layer 200, a circuit device including various signal lines, thin-film transistors, and a capacitor may be provided for each subpixel (P1, P2, P3). The signal lines may include a gate line, a data line, a power line, and a reference line. The thin-film transistors may include a switching thin-film transistor, a driving thin-film transistor, and a sensing thin-film transistor.

The switching thin-film transistor may be switched by a gate signal supplied to the gate line. The switching thin-film transistor may supply a data voltage, which may be supplied from the data line, to the driving thin-film transistor.

The driving thin-film transistor may be switched by a data voltage supplied from the switching thin-film transistor. The driving thin-film transistor may generate a data current from power source supplied from the power line, and may supply the data current to the first electrode 310, 320, and 330.

The sensing thin-film transistor may sense a deviation of threshold voltage in the driving thin-film transistor, which may cause deterioration of picture quality. The sensing thin-film transistor may supply a current of the driving thin-film transistor to the reference line in response to a sensing control signal supplied from the gate line or an additional sensing line.

The capacitor may maintain the data voltage supplied to the driving thin-film transistor for one frame period. The capacitor may be connected to each of gate and source terminals of the driving thin-film transistor.

The insulating layer 500 may be on the circuit device layer 200. The insulating layer 500 may protect the circuit device layer 200, and may also planarize an upper surface of the substrate 100. The insulating layer 500 may include an organic insulating material, but embodiments are not limited to this material. For example, the insulating layer 500 may include an inorganic insulating material.

The first electrode 310, 320, and 330 may be patterned for each subpixel (P1, P2, P3) on the insulating layer 500. The first electrode 310, 320, and 330 may be connected to a respective driving thin-film transistor in the circuit device layer 200. For example, the first electrode 310, 320, and 330 may be connected to a source terminal or drain terminal of the driving thin-film transistor. For example, a contact hole for exposing the source terminal or drain terminal of the driving thin-film transistor may be in the insulating layer 500 and the circuit device layer 200. The first electrode 310, 320, and 330 may be connected to the source terminal or drain terminal of the driving thin-film transistor via a respective contact hole.

The electroluminescent display device according to an embodiment of the present disclosure may be the top-emission type. For example, the first electrode 310, 320, and 330 may upwardly reflect light emitted from the emission layer 700. For example, the first electrode 310, 320, and 330 may be formed in a dual-layered structure including a reflective layer configured to reflect light, and a transparent conductive layer configured to supply a hole to the emission layer 700.

The bank 600 may cover both ends of the first electrode 310, 320, and 330 on the insulating layer 500. For example, the bank 600 may cover some areas of upper surface and lateral surface at both ends of the first electrode 310, 320, and 330. Thus, t may be possible to prevent a current from being concentrated on the ends of the first electrode 310, 320, and 330, to reduce or prevent lowering of emission efficiency. For example, some areas of the upper surface of the first electrode 310, 320, and 330, which may be exposed without being covered by the bank 600, may become the emission area. The bank 600 may include an inorganic insulating film, but embodiments are not limited to this structure. For example, the bank 600 may include an organic insulating film.

The trench (T) of the groove structure may be provided in the bank 600 and the insulating layer 500. The trench (T) may extend to a predetermined area of the insulating layer 500 through the bank 600 in the boundary area between the subpixels (P1, P2, P3). Thus, the trench (T) may be obtained by removing predetermined areas of the bank 600 and the insulating layer 500. Also, although not shown, the trench (T) may extend to the inside of the circuit device layer 200 below the insulating layer 500. Also, when the bank 600 includes an organic material layer with a large thickness, the trench (T) may be formed by removing a predetermined area of the bank 600 without passing through the bank 600.

The trench (T) may be provided to disconnect at least some of the emission layer 700. For example, at least some of the emission layer 700 may be noncontiguous (e.g., disconnected or disconnectedly provided) inside the trench (T), and it may be possible to reduce or prevent a charge transfer between the neighboring subpixels (P1, P2, P3) through the emission layer 700, and to reduce or prevent a leakage current between the neighboring subpixels (P1, P2, P3). To make at least some of the emission layer 700 noncontiguous (e.g., disconnected or disconnectedly provided) inside the trench (T), a depth (b) of the trench (T) may be larger than a width (a) of the trench (T), for example. For example, the width (a) of the trench (T) may be within a range of 0.1 μm to 0.2 μm, and the depth (b) of the trench (T) may be within a range of 0.2 μm to 0.4 μm, for example. If the width (a) of the trench (T) were less than 0.1 μm, the width (a) of the trench (T) may be too small for the emission layer 700 to be sequentially deposited on the trench (T). For example, at least some of the emission layer 700 may be contiguous (e.g., may be connected or connectedly provided, or may not be provided disconnectedly) inside the trench (T). If the width (a) of the trench (T) were more than 0.2 μm, a pore (H) may be not formed inside the trench (T), and the emission layer 700 may be sequentially deposited in the trench (T). For example, at least some of the emission layer 700 may be contiguous inside the trench (T). If the depth (b) of the trench (T) were less than 0.2 μm, the pore (H) may be not formed inside the trench (T) and the emission layer 700 may be sequentially deposited in the trench (T), and at least some of the emission layer 700 may be contiguous inside the trench (T). If the depth (b) of the trench (T) were more than 0.4 μm, a process of forming the trench (T) may be not simple.

In consideration of the width (a) of the trench (T) within a range of 0.1 μm to 0.2 μm, formed in the boundary between the subpixels (P1, P2, P3), an interval between the first electrodes 310, 320, and 330 spaced apart from each other with the trench (T) interposed therebetween may be 0.4 μm or more than 0.4 μm, for example.

The emission layer 700 may be formed in the area in each of the plurality of subpixels (P1, P2, P3), and also formed in the boundary between the plurality of subpixels (P1, P2, P3). For example, the emission layer 700 may be formed on the first electrode 310, 320, and 330 and the bank 600, and may also be formed on the insulating layer 500 inside the trench (T).

The emission layer 700 may be configured to emit white (W) light. For example, the emission layer 700 may include a plurality of stacks configured to emit different-colored light. For example, the emission layer 700 may include a first stack 710, a second stack 730, and a charge generation layer 720 between the first stack 710 and the second stack 730.

The emission layer 700 may be inside the trench (T), and may also be over the trench (T). According to an embodiment of the present disclosure, when the emission layer 700 is formed inside the trench (T), at least some of the emission layer 700 may be noncontiguous (e.g., disconnected or disconnectedly provided) so that it may be possible to reduce or prevent a leakage current between the neighboring subpixels (P1, P2, P3).

The first stack 710 may be formed on lateral surfaces inside the trench (T), and may also be formed on a lower surface inside the trench (T). For example, with respect to a central portion of the trench (T), a first portion 710a of the first stack 710 at one lateral surface inside the trench (T), e.g., a left lateral surface inside the trench (T), may be noncontiguous (e.g., disconnected or disconnectedly provided) with a second portion 710b of the first stack 710 at the other lateral surface inside the trench (T), e.g., a right lateral surface inside the trench (T). It should be appreciated that the terms "left" and "right" are used herein for convenience of description, and are interchangeable and should be understood by one of ordinary skill in the art. Also, a third portion 710c of the first stack 710 on the lower surface inside the trench (T) may be noncontiguous (e.g., disconnected or disconnectedly provided) while being separated from the first portion 710a and the second portion 710b of the first stack 710 on the lateral surfaces inside the trench (T). Accordingly, a charge may be not transferred through the first stack 710 between the neighboring subpixels (P1, P2, P3), which may be adjacent to each other with the trench (T) interposed therebetween.

Also, the charge generation layer 720 may be on the first stack 710. For example, the charge generation layer 720 may be formed over the trench (T) without extending inside the trench (T). For example, the charge generation layer 720 may be formed above an upper surface 600a of one end of the bank 600 perforated by the trench (T), for example, above the upper surface 600 of one end of the bank 600 in contact with the trench (T), but embodiments are not limited to this structure. For example, the charge generation layer 720 may extend inside the trench (T).

For example, with respect to the central portion of the trench (T), a first portion 720a of the charge generation layer 720 at one side of the trench (T), e.g., a left side of the trench (T), may be noncontiguous (e.g., disconnected or disconnectedly provided) with a second portion 720b of the charge generation layer 720 at the other side of the trench (T), e.g., a right side of the trench (T). The first portion 720a of the charge generation layer 720 may be formed on the first portion 710a of the first stack 710, and the second portion 720b of the charge generation layer 720 may be formed on the second portion 710b of the first stack 710. Accordingly, charges may be not transferred between the subpixels (P1, P2, P3) adjacently disposed with the trench (T) interposed therebetween through the charge generation layer 720.

Also, the second stack 730 may be contiguous (e.g., connectedly provided) on the charge generation layer 720 between the subpixels (P1, P2, P3), which may be adjacent to each other with the trench (T) interposed therebetween. For example, with respect to the central portion of the trench (T), a first portion 730a of the second stack 730 at one side of the trench (T), e.g., a left side of the trench (T), may be connected to a second portion 730b of the second stack 730 at the other side of the trench (T), e.g., a right side of the trench (T). Accordingly, charges may be transferred between the subpixels (P1, P2, P3), adjacently disposed with the trench (T) interposed therebetween, through the second stack 730.

For example, a first thickness (d1) of the second stack 730 that may correspond to some area of the trench (T) in which the charge generation layer 720 may be noncontiguous (e.g., disconnected or disconnectedly provided), may be relatively smaller than a second thickness (d2) of the second stack 730 that may correspond to the remaining areas, which may not overlap the trench (T). For example, the first thickness (d1) of the second stack 730, which may overlap the area between the first portion 720*a* of the charge generation layer 720 and the second portion 720*b* of the charge generation layer 720, may be relatively smaller than the second thickness (d2) of the first portion 730*a* or the second portion 730*b* of the second stack 730, which may overlap the bank 600.

When the second stack 730 is firstly deposited while being noncontiguous (e.g., disconnected or disconnectedly provided) on the first portion 720*a* of the charge generation layer 720 and the second portion 720*b* of the charge generation layer 720, the second stack 730 on the first portion 720*a* of the charge generation layer 720 may contact the second stack 730 on the second portion 720*b* of the charge generation layer 720 as the second stack 730 may be further deposited. This may be a reason why the first thickness (d) of the second stack 730 may be relatively small. Lower some areas of the second stack 730 with the first thickness (d1) corresponding to the relatively small thickness may be noncontiguous (e.g., disconnected or disconnectedly provided) above the trench (T). For example, lower some areas of the first portion 730*a* of the second stack 730, e.g., a hole transporting layer ("HTL layer"), may be noncontiguous (e.g., disconnected or disconnectedly provided) with lower some areas of the second portion 730*b* of the second stack 730, for example, the HTL layer.

As described above, the pore (H) may be formed inside the trench (T) by the above structure of the first stack 710, the charge generation layer 720, and the second stack 730. The pore (H) may be defined by the insulating layer 500 and the emission layer 700. The pore (H) may be below the emission layer 700. For example, the pore (H) below the emission layer 700 may be defined by the insulating layer 500, the first stack 710, the charge generation layer 720, and the second stack 720. The pore (H) may extend from the inside of the trench (T) to the upper portion of the trench (T), and an end (HT) of the pore (H) may be higher than at least some of the emission layer 700, which may be noncontiguous (e.g., disconnected or disconnectedly provided) inside the trench (T). For example, the end (HT) of the pore (H) may be higher than the charge generation layer 720, and the first portion 720*a* of the charge generation layer 720 and the second portion 720*b* of the charge generation layer 720 may be noncontiguous (e.g., disconnected or disconnectedly provided) with each other due to the pore (H).

Conductivity of the charge generation layer 720 may be higher than that of each of the first stack 710 and the second stack 730. For example, an N-type charge generation layer of the charge generation layer 720 may include a metal material. Conductivity of the charge generation layer 720 may be higher than that of each of the first stack 710 and the second stack 730. Thus, the charge transfer between the subpixels (P1, P2, P3), which may be adjacent to each other, may be made through the charge generation layer 720, and any charge transfer through the second stack 730 may be insignificant. Thus, according to an embodiment of the present disclosure, the charge generation layer 720 may be noncontiguous (e.g., disconnected or disconnectedly provided) inside the trench (T) so that it may be possible to reduce the charge transfer between the subpixels (P1, P2, P3), which may be adjacent to each other, to reduce or prevent a leakage current.

The second electrode 800 may be on the emission layer 700. The second electrode 800 may function as a cathode of the electroluminescent display device. In a similar manner as the emission layer 700, the second electrode 800 may be formed in each of the subpixels (P1, P2, P3), and may also be formed in the boundary area between the subpixels (P1, P2, P3).

The electroluminescent display device according to an embodiment of the present disclosure may be formed in the top-emission type, and the second electrode 800 may include a transparent conductive material capable of upwardly transmitting light emitted from the emission layer 700. Also, the second electrode 800 may include a semi-transparent electrode so that it may be possible to obtain a micro-cavity effect for each subpixel (P1, P2, P3). When the second electrode 800 includes the semi-transparent electrode, the micro-cavity effect may be obtained by repetitive reflection and re-reflection of the light between the second electrode 800 and the first electrode 310, 320, and 330, to improve light efficiency.

The encapsulation layer 850 may be formed on the second electrode 800 to reduce or prevent external moisture from permeating into the emission layer 700. The encapsulation layer 850 may be formed as a single-layered structure of an inorganic insulating material, or as a deposition structure obtained by alternately depositing an inorganic insulating material and an organic insulating material, but embodiments are not limited to these structures.

The color filter layer 910, 920, and 930 may be on the encapsulation layer 850. The color filter layer 910, 920 and 903 may include a red (R) color filter 910 in the first subpixel (P1), a green (G) color filter 920 in the second subpixel (P2), and a blue (B) color filter in the third subpixel (P3), but embodiments are not limited to this structure. Although not shown, a black matrix may be additionally provided between each of the color filter layers 910, 920, and 930 to reduce or prevent light from leaking into the boundary area between the subpixels (P1, P2, P3).

FIGS. 3 to 6 are cross-sectional views illustrating examples of a first electrode, an emission layer, and a second electrode according to embodiments of the present disclosure.

Figure 3:
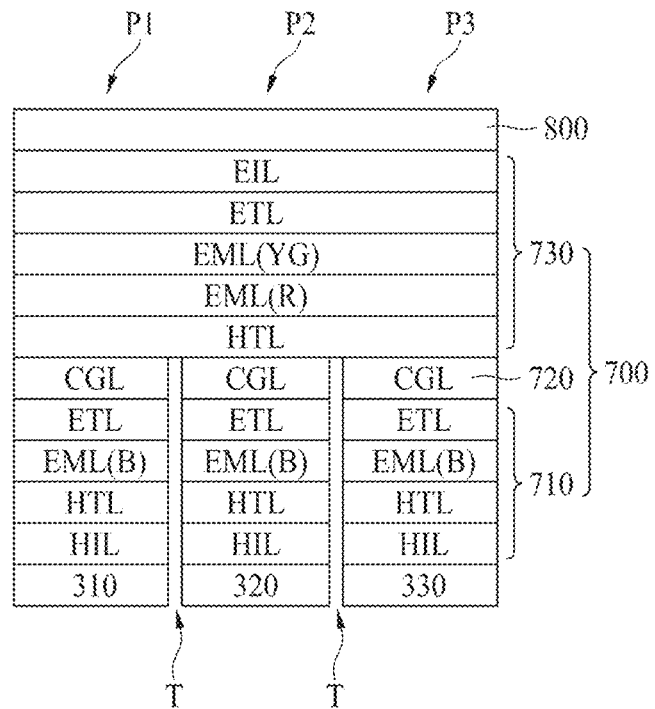
FIGS. 3 to 6 are cross-sectional views illustrating examples of a first electrode, an emission layer, and a second electrode according to embodiments of the present disclosure.

As shown in the example of FIG. 3, one first electrode 310 may be in a first subpixel (P1), another first electrode 320 may be in a second subpixel (P2), and another first electrode 330 may be in a third subpixel (P3). An emission layer 700 may be formed on the first electrode 310, 320, and 330. The emission layer 700 may include a first stack 710, a second stack 730, and a charge generation layer (CGL) 720.

The first stack 710 may be formed as a deposition structure obtained by sequentially depositing a hole injecting layer (HIL), a hole transporting layer (HTL), a blue (B)-emitting layer (EML(B)), and an electron transporting layer (ETL). The first stack 710 may be noncontiguous (e.g., disconnected or disconnectedly provided) in the boundary area between the subpixels (P1, P2, P3), for example, an area of a trench (T).

The charge generation layer (CGL) 720 may supply charges to the first stack 710 and the second stack 730. The charge generation layer (CGL) 720 may include an N-type charge generation layer configured to supply an electron to the first stack 710, and a P-type charge generation layer configured to supply a hole to the second stack 730. The N-type charge generation layer may include a dopant of a metal material, although embodiments are not limited thereto.

The charge generation layer (CGL) 720 may be noncontiguous (e.g., disconnected or disconnectedly provided) in the boundary area between the subpixels (P1, P2, P3), for example, the area of the trench (T). The second stack 730 may be provided on the charge generation layer (CGL) 720. The second stack 730 may be formed as a deposition structure obtained by sequentially depositing a hole transporting layer (HTL), a red (R)-emitting layer (EML(R)), a yellow-green (YG)-emitting layer (EML(YG)), an electron transporting layer (ETL), and an electron injecting layer (EIL). A deposition order of the red (R)-emitting layer (EML(R)) and the yellow-green (YG)-emitting layer (EML (YG)) may be changeable.

The second stack 730 may be contiguous (e.g., connectedly provided) across the subpixels (P1, P2, P3). However, as described above, some lower areas of the second stack 730 may be noncontiguous (e.g., disconnected or disconnectedly provided) in the boundary between the subpixels (P1, P2, P3), for example, in the trench (T) area. For example, the hole transporting layer (HTL) in the second stack 730 may be noncontiguous (e.g., disconnected or disconnectedly provided); the hole transporting layer (HTL) and the red (R)-emitting layer (EML(R)) in the second stack 730 may be noncontiguous (e.g., disconnected or disconnectedly provided); the hole transporting layer (HTL), the red (R)-emitting layer (EML(R)) and the yellow-green (YG)-emitting layer (EML(YG)) included in the second stack 730 may be noncontiguous (e.g., disconnected or disconnectedly provided); or the hole transporting layer (HTL), the red (R)-emitting layer (EML(R)), the yellow-green (YG)-emitting layer (EML(YG)) and the electron transporting layer (ETL) may be noncontiguous (e.g., disconnected or disconnectedly provided).

The second electrode 800 may be on the emission layer 700. The second electrode 800 may be contiguous (e.g., connectedly provided) in the boundary between the subpixels (P1, P2, P3). In the structure of the FIG. 3 example, white light may be obtained by combination of the blue (B)-emitting layer (EML(B)) in the first stack 710, and the red (R)-emitting layer (EML(R)) and the yellow-green (YG)-emitting layer (EML(YG)) in the second stack 730. The second stack 730 may include only the yellow-green (YG)-emitting layer (EML(YG)), without the red (R)-emitting layer (EML(R)), so that it may be possible to obtain white light by combination of the blue (B)-emitting layer (EML(B)) in the first stack 710 and the yellow-green (YG)-emitting layer (EML(YG)) in the second stack 730. However, a red emission efficiency may be deteriorated in the third subpixel (P3). Thus, the second stack 730 may include both the red (R)-emitting layer (EML(R)) and the yellow-green (YG)-emitting layer (EML(YG)).

Figure 4:
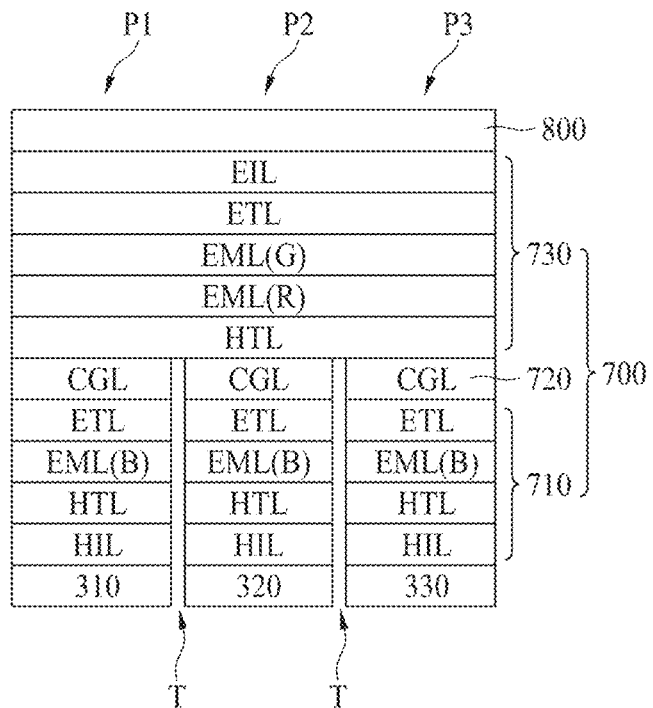

The structure of the FIG. 4 example is substantially similar to the structure of the FIG. 3 example, except that the second stack 730 includes the green (G)-emitting layer (EML(G)) instead of the yellow-green (YG)-emitting layer (EML(YG)). In the example of FIG. 4, white light may be obtained by combination of the blue (B)-emitting layer (EML(B)) in the first stack 710, and the red emitting layer (EML(R)) and the green emitting layer (EML(G)) in the second stack 730. Both the red emitting layer (EML(R)) and the green emitting layer (EML(G)) may be included in the second stack 730. A green emission efficiency may be improved in the second subpixel (P2), and a red emission efficiency may be improved in the third subpixel (P3).

Figure 5:
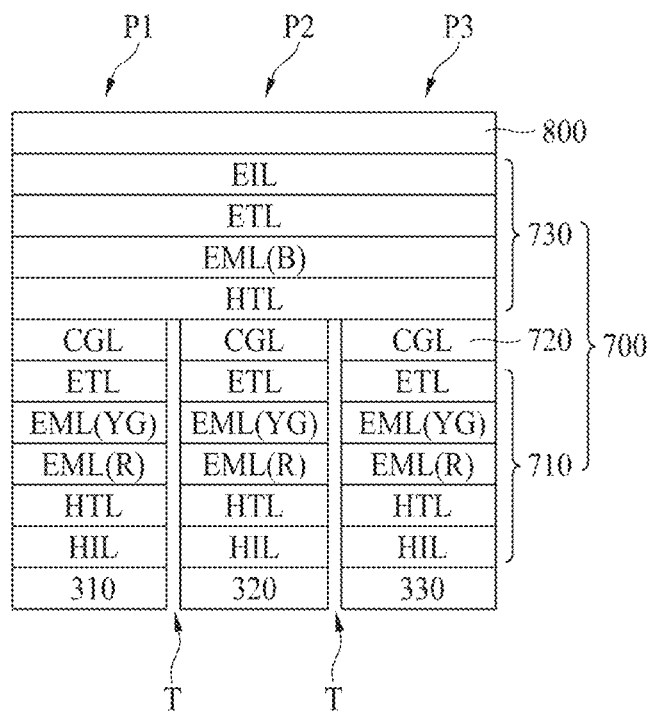

The structure of the FIG. 5 is substantially similar to the structure of the FIG. 3 example, except that the first stack 710 includes the red (R)-emitting layer (EML(R)) and the yellow-green (YG)-emitting layer (EML(YG)) instead of the blue (B)-emitting layer (EML(B)), and the second stack 730 includes the blue (B)-emitting layer (EML(B)) instead of the red (R)-emitting layer (EML(R)) and the yellow-green (YG)-emitting layer (EML(YG)). In FIG. 5, a deposition order of the red (R)-emitting layer (EML(R)) and the yellow-green (YG)-emitting layer (EML(YG)) may be changeable.

Similarly to the example of FIG. 3, the structure of FIG. 5 may include the first stack 710 including the red (R)-emitting layer (EML(R)) and the yellow-green (YG)-emitting layer (EML(YG)), and a red emission efficiency may be improved in the third subpixel (P3).

Figure 6:
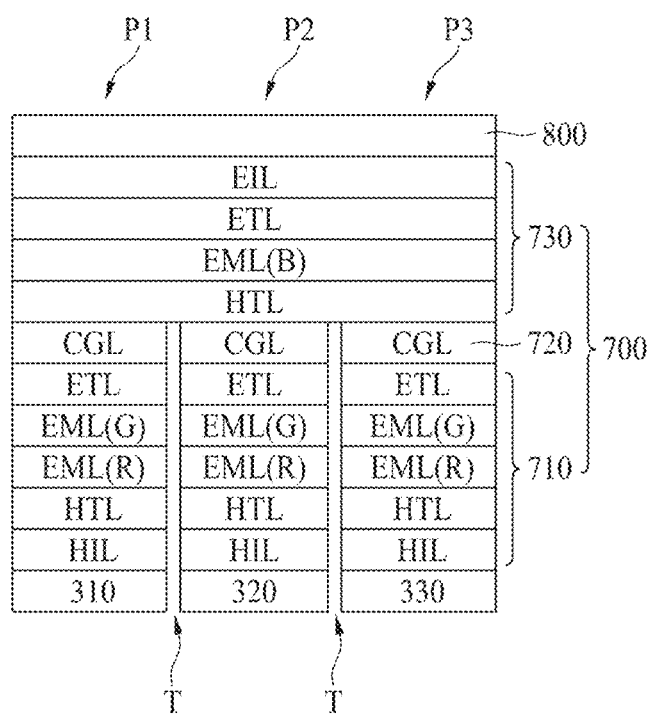

The structure of FIG. 6 is substantially similar to the structure of the FIG. 3 example, except that the first stack 710 includes the green (G)-emitting layer (EML(G)) instead of the yellow-green (YG)-emitting layer (EML(YG)).

Similarly to the example of FIG. 4, the structure of FIG. 6 may include the first stack 710 including the red (R)-emitting layer (EML(R)) and the green (G)-emitting layer (EML(G)). A green emission efficiency may be improved in the second subpixel (P2), and a red emission efficiency may be improved in the third subpixel (P3).

Figure 7:
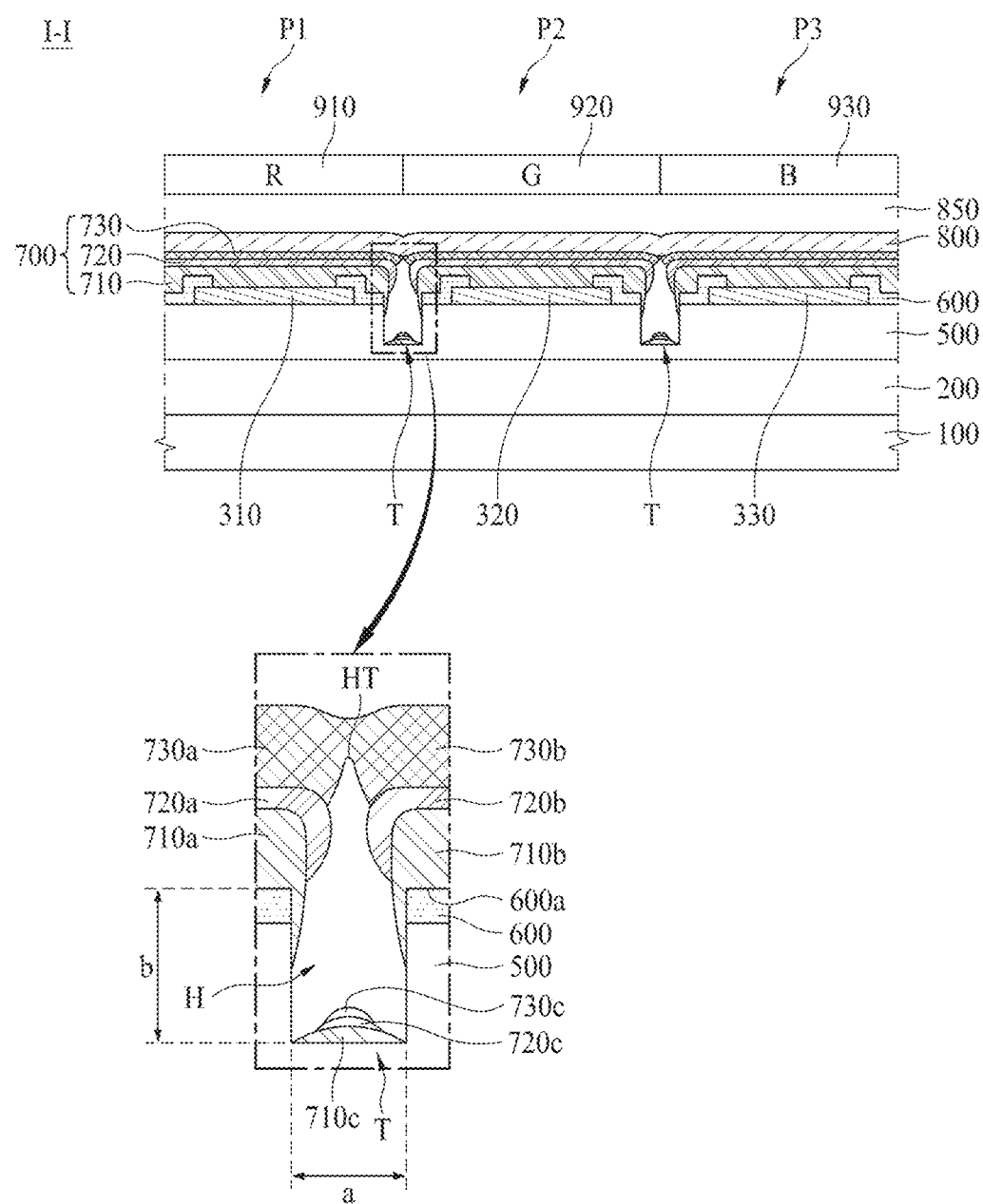
FIG. 7 is a cross-sectional view illustrating an electroluminescent display device according to an embodiment of the present disclosure.

FIG. 7 is a cross-sectional view illustrating an electroluminescent display device according to an embodiment of the present disclosure.

The structure of the FIG. 7 example is substantially similar to the FIG. 2 example, except that a third portion 720c of a charge generation layer 720 and a third portion 730c of a second stack 730 are additionally provided in the structure of FIG. 7. Accordingly, the same reference numbers will be used throughout the drawings to refer to the same or like parts, and only the different structures will be described.

As shown in the example of FIG. 7, when a first portion 720a and a second portion 720b of a charge generation layer 720 are deposited while being spaced apart from each other, some of the charge generation layer 720 may freely fall to the area between the first portion 720a and the second portion 720b, and a third portion 720c of the charge generation layer 720 may be additionally provided on a third portion 710c of the first stack 710 on an inner lower surface of a trench (T). The third portion 720c of the charge generation layer 720 may be noncontiguous (e.g., disconnected or disconnectedly provided) with the first portion 720a of the charge generation layer 720 and the second portion 720b of the charge generation layer 720.

Also, when a second stack 730 is deposited and formed, some of the second stack 730 may freely fall to the area between the first portion 720a and the second portion 720b of the charge generation layer 720, and a third portion 730c of the second stack 730 may be additionally provided on the third portion 720c of the charge generation layer 720. The third portion 730c of the second stack 730 may be noncontiguous (e.g., disconnected or disconnectedly provided) with a first portion 730a of the second stack 730 and a second portion 730b of the second stack 730. However, the third portion 730c of the second stack 730 may not be provided.

The above-described structure of FIG. 7 may be similarly applied to all of the following example embodiments of the present disclosure.

Figure 8:
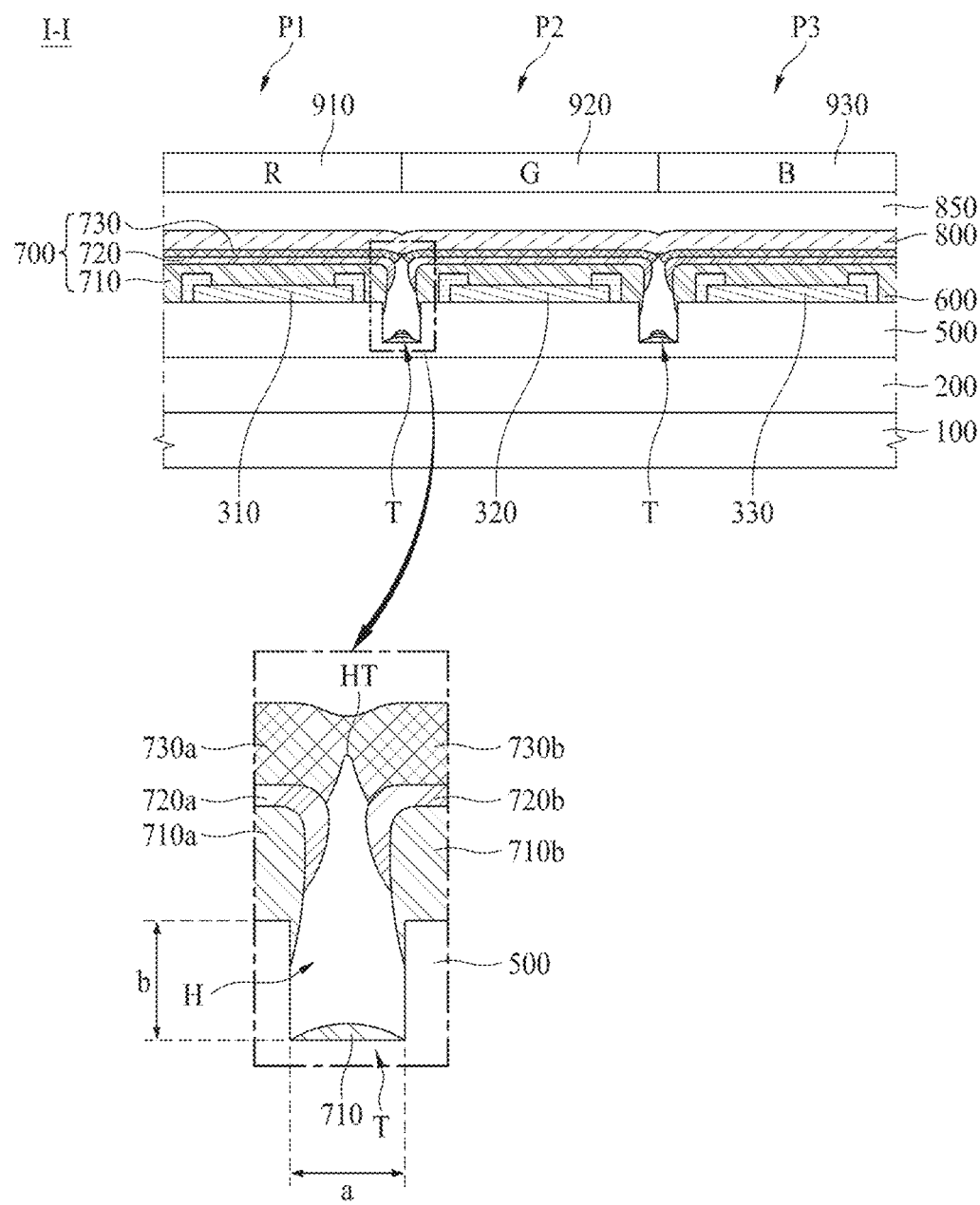
FIG. 8 is a cross-sectional view illustrating an electroluminescent display device according to an embodiment of the present disclosure.

FIG. 8 is a cross-sectional view illustrating an electroluminescent display device according to an embodiment of the present disclosure.

Except for a bank 600, the electroluminescent display device of the FIG. 8 example is substantially similar in structure to the electroluminescent display device of the FIG. 2 example. The same reference numbers will be used throughout the drawings to refer to the same or like parts, and only the different structures will be described.

With reference to the example of FIG. 2, the bank 600, which may cover the end of the first electrode 310, 320, and 330, may be not patterned for each subpixel (P1, P2, P3), but may be formed as one contiguous body among the neighboring subpixels (P1, P2, P3). For example, the bank 600 may be formed in the entire boundary between the neighboring subpixels (P1, P2, P3). Accordingly, the bank 600 may be in contact with the trench (T) between the subpixels (P1, P2, P3), and the trench (T) may be formed in the bank 600 and the insulating layer 500 therebelow. In the example of FIG. 2, the bank 600 may be formed in the entire boundary area between the subpixels (P1, P2, P3), and then predetermined areas of the bank 600 and the insulating layer 500 therebelow may be removed from the boundary area between the subpixels (P1, P2, P3) to form the trench (T).

With reference to the example of FIG. 8, a respective bank 600, which may cover an end of a first electrode 310, 320, and 330, may be patterned for each subpixel (P1, P2, P3). For example, each bank 600 may surround the periphery of each of the first electrode 310, 320, and 330, and the banks 600 may be spaced apart from each other. Accordingly, the bank 600 may be not in contact with a trench (T) between the subpixels (P1, P2, P3), and the trench (T) may be formed only in the insulating layer 500. In the example of FIG. 8, the bank 600 may be patterned for each subpixel (P1, P2, P3), and then predetermined areas of the insulating layer 500 may be removed to form a trench (T).

Figure 9:
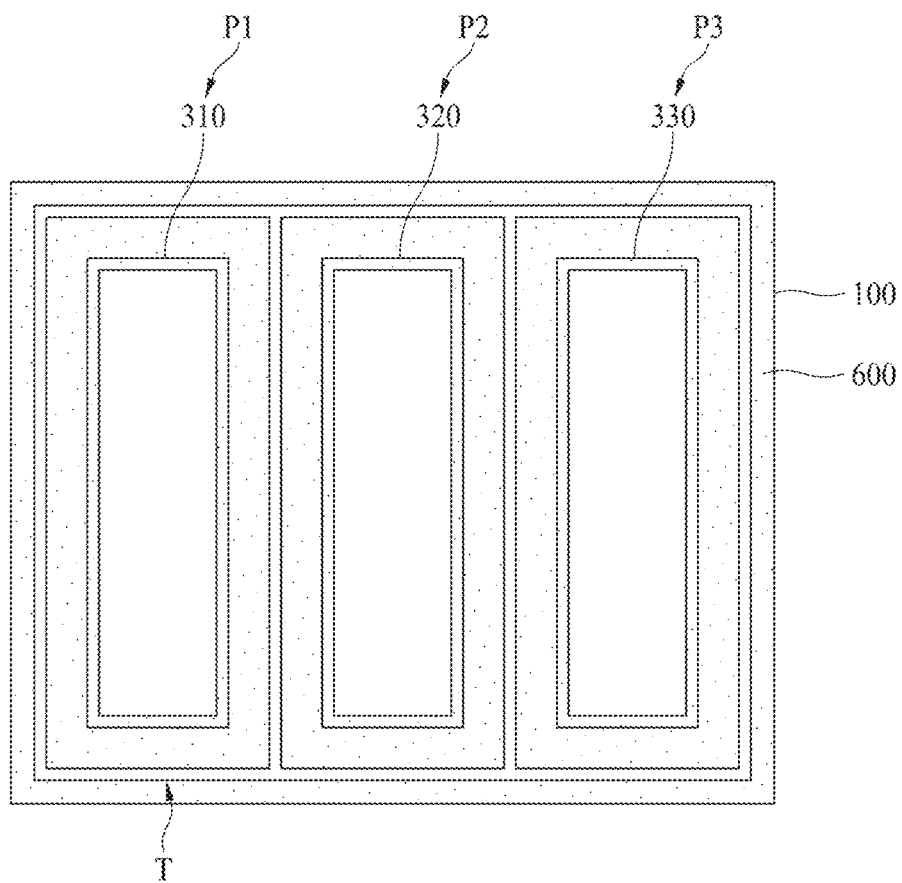
FIG. 9 is a plane view illustrating an electroluminescent display device according to an embodiment of the present disclosure.

FIG. 9 is a plane view illustrating an electroluminescent display device according to an embodiment of the present disclosure.

Except for a structure of a trench (T), the electroluminescent display device of the FIG. 9 example is substantially similar in structure to the electroluminescent display device of the FIG. 1 example. The same reference numbers will be used throughout the drawings to refer to the same or like parts, and only the different structures will be described.

With reference to FIG. 9, a trench (T) may have a shape corresponding to a shape of an individual subpixel (P1, P2, P3), and may surround the entire periphery of the subpixels (P1, P2, P3). Thus, in the example of FIG. 9, the trench (T) may be formed in the boundary between the corresponding individual subpixel (P1, P2, P3) and each of the four-sided neighboring subpixels (P1, P2, P3) of the corresponding subpixel, to reduce or prevent a leakage current.

Figure 10:
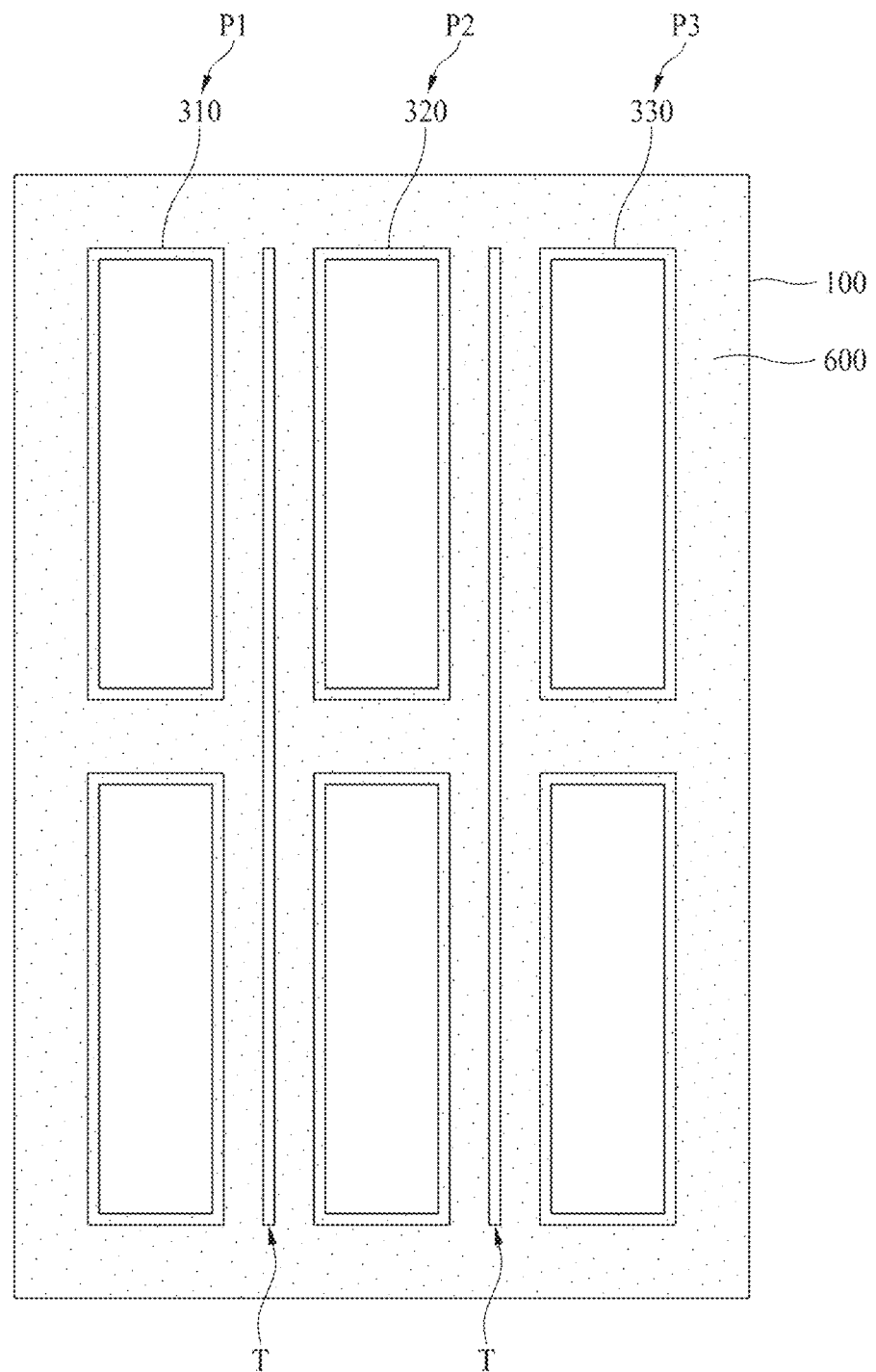
FIG. 10 is a plane view illustrating an electroluminescent display device according to an embodiment of the present disclosure.

FIG. 10 is a plane view illustrating an electroluminescent display device according to an embodiment of the present disclosure.

As shown in the example of FIG. 10, a first subpixel (P1), a second subpixel (P2), and a third subpixel (P3) may be sequentially arranged along a horizontal direction. An arrangement structure, including the first subpixel (P1), the second subpixel (P2), and the third subpixel (P3) arranged in the horizontal direction, may be repetitively provided to form a plurality of rows. For convenience of explanation, FIG. 10 shows only two rows, but embodiments are not limited thereto.

For example, along a vertical direction crossing be horizontal direction, another first subpixel (P1) for emitting the same-colored light may be below the first subpixel (P1), another second subpixel (P2) for emitting the same-colored light may be below the second subpixel (P2), and another third subpixel (P3) for emitting the same-colored light may be below the third subpixel (P3).

Accordingly, along the vertical direction, the subpixels (P1, P2, P3) for emitting the same-colored light may be arranged in a straight line. Thus, even if a leakage current were generated between the subpixels (P1, P2, P3) for emitting the same-colored light, a problem related to a mixture of colored light, such as deterioration of picture quality, may not occur. Accordingly, a trench (T) may not be formed in the boundary between the subpixels (P1, P2, P3) configured to emit the same-colored light and to adjacently disposed along the vertical direction.

In a similar manner as the example of FIG. 1, the trench (T) may be formed in the boundary between the subpixels (P1, P2, P3) adjacently disposed along the horizontal direction. For example, the trench (T) may be formed in a contiguous straight-line structure along the vertical direction. For example, the trench (T) may be formed in the downwardly contiguous straight-line structure from the boundary between the first subpixel (P1) and the second subpixel (P2) in the first row to the boundary between the first subpixel (P1) and the second subpixel (P2) in the second row.

In the example of FIG. 10, the arrangement structure of the subpixels (P1, P2, P3) may be similarly applied to the plurality of rows which may be adjacent to each other in an up-and-down (e.g., vertical) direction. Although not shown, according to an embodiment of the present disclosure, the arrangement structure of the subpixels (P1, P2, P3) may be differently applied to the plurality of rows, which may be adjacent to each other in the up-and-down direction. For example, the trench (T) may be formed in the boundary area between the subpixels (P1, P2, P3), which may be adjacent to each other in the up-and-down direction.

Figure 11:
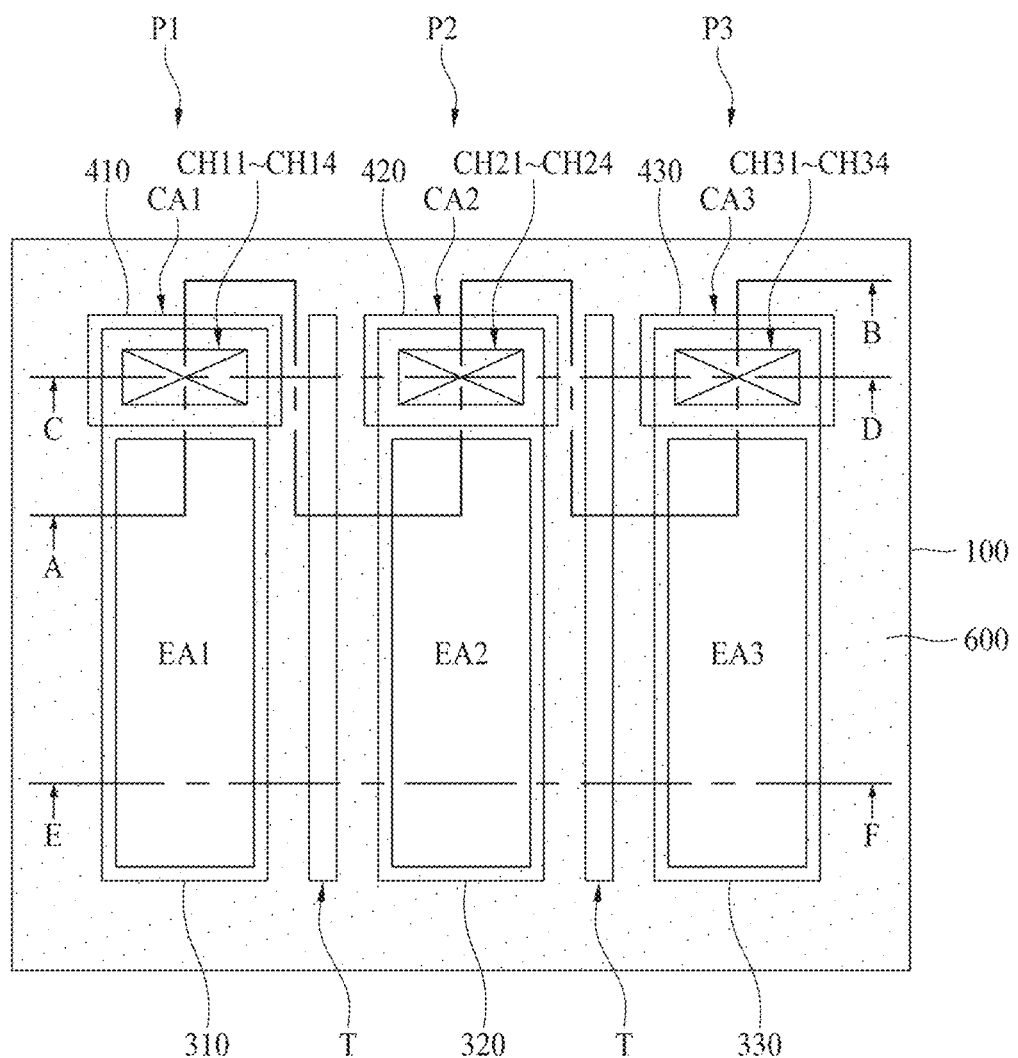
FIG. 11 is a plane view illustrating an electroluminescent display device according to an embodiment of the present disclosure.

FIG. 11 is a plane view illustrating an electroluminescent display device according to an embodiment of the present disclosure.

As shown in the FIG. 11 example, the electroluminescent display device according to an embodiment of the present disclosure may include a substrate 100, a first electrode 310, 320, and 330, a contact electrode 410, 420, and 430, and a bank 600. A plurality of subpixels (P1, P2, P3) may be on the substrate 100.

A plurality of emission areas (EA1, EA2, EA3) and a plurality of contact areas (CA1, CA2, CA3) may be provided in the plurality of subpixels (P1, P2, P3). For example, the first emission area (E1) and the first contact area (CA1) may be in the first subpixel (P1), the second emission area (E2) and the second contact area (CA2) may be in the second subpixel (P2), and the third emission area (E3) and the third contact area (CA3) may be in the third subpixel (P3).

The plurality of emission areas (EA1, EA2, EA3) may be defined by the bank 600. For example, exposed areas, which may be exposed without being covered by the bank 600, may become the plurality of emission areas (EA1, EA2, EA3). The first emission area (EA1) may be a red emission area, the second emission area (EA2) may be a green emission area, and the third emission area (EA3) may be a blue emission area, but embodiments are not limited to this structure.

The plurality of contact areas (CA1, CA2, CA3) may be provided in the area covered by the bank 600. Accordingly, the plurality of contact areas (CA1, CA2, CA3) may be at one peripheral area of the plurality of emission areas (EA1, EA2, EA3). For example, the first contact area (CA1) may be at an upper peripheral area of the first emission area (EA1), the second contact area (CA2) may be at an upper peripheral area of the second emission area (EA2), and the third contact area (CA3) may be at an upper peripheral area of the third emission area (EA3), but embodiments are not limited to this structure.

A plurality of contact holes (CH11 to CH14, CH21 to CH24, CH31 to CH34) may be provided in the plurality of contact areas (CA1, CA2, CA3), which may cause step differences. Thus, if at least some areas in the plurality of contact areas (CA1, CA2, CA3) were exposed without being covered by the bank 600 and the some areas in the plurality of contact areas (CA1, CA2, CA3) were to overlap the plurality of emission areas (EA1, EA2, EA3), a problem related to non-uniformity of emission may be generated in the emission areas (EA1, EA2, EA3) due to the step differences. Thus, in an embodiment of the present disclosure, the plurality of contact areas (CA1, CA2, CA3) may be covered by the bank 600, and it may be possible to reduce or prevent the plurality of contact areas (CA1, CA2, CA3) from overlapping the plurality of emission areas (EA1, EA2, EA3), but embodiments are not limited to this structure. At least some areas in the plurality of contact areas (CA1, CA2, CA3) may not be covered by the bank 600 so that at least some areas in the plurality of contact areas (CA1, CA2, CA3) may overlap the plurality of emission areas (EA1, EA2, EA3).

The first electrode 310, 320, and 330 may be patterned for each individual subpixel (P1, P2, P3). For example, one first electrode 310 may be in the first subpixel (P1), another first electrode 320 may be in the second subpixel (P2), and another first electrode 330 may be in the third subpixel (P3). The first electrode 310, 320, and 330 may function as an anode of the electroluminescent display device.

The first electrode 310 of the first subpixel (P1) may extend from the first emission area (EA1) to the first contact area (CA1), and the exposed portion of the first electrode 310, which may be exposed without being covered by the bank 600, may become the first emission area (EA1). The first electrode 310 of the first subpixel (P1) may be connected to the first contact electrode 410 in the first contact area (CA1).

The first electrode 320 of the second subpixel (P2) may extend from the second emission area (EA2) to the second contact area (CA2), and the exposed portion of the first electrode 320, which may be exposed without being covered by the bank 600, may become the second emission area (EA2). The first electrode 320 of the second subpixel (P2) may be connected to the second contact electrode 420 in the second contact area (CA2).

The first electrode 330 of the third subpixel (P3) may extend from the third emission area (EA3) to the third contact area (CA3), and the exposed portion of the first electrode 330, which may be exposed without being covered by the bank 600, may become the third emission area (EA3). The first electrode 330 of the third subpixel (P3) may be connected to the third contact electrode 430 in the third contact area (CA3).

The contact electrode 410, 420, and 430 may be provided in the contact area (CA1, CA2, CA3). For example, the first contact electrode 410 may be in the first contact area (CA1), the second contact electrode 420 may be in the second contact area (CA2), and the third contact electrode 430 may be in the third contact area (CA3).

The first contact electrode 410 may be connected to the first electrode 310, and may overlap the first electrode 310 of the first subpixel (P1) in the first contact area (CA1). Although a width of the first contact electrode 410 is illustrated as being larger than a width of the first electrode 310, embodiments are not limited to this structure. For example, a width of the first contact electrode 410 may be the same as or smaller than a width of the first electrode 310.

The second contact electrode 420 may be connected to the first electrode 320, and may overlap the first electrode 320 of the second subpixel (P2) in the second contact area (CA2). Although a width of the second contact electrode 420 is illustrated as being larger than a width of the first electrode 320, embodiments are not limited to this structure. For example, a width of the second contact electrode 420 may be the same as or smaller than a width of the first electrode 320.

The third contact electrode 430 may be connected to the first electrode 330, and may overlap the first electrode 330 of the third subpixel (P3) in the third contact area (CA3). Although a width of the third contact electrode 430 is illustrated as being larger than a width of the first electrode 330, embodiments are not limited to this structure. For example, a width of the third contact electrode 430 may be the same as or smaller than a width of the first electrode 330.

Figure 12A:
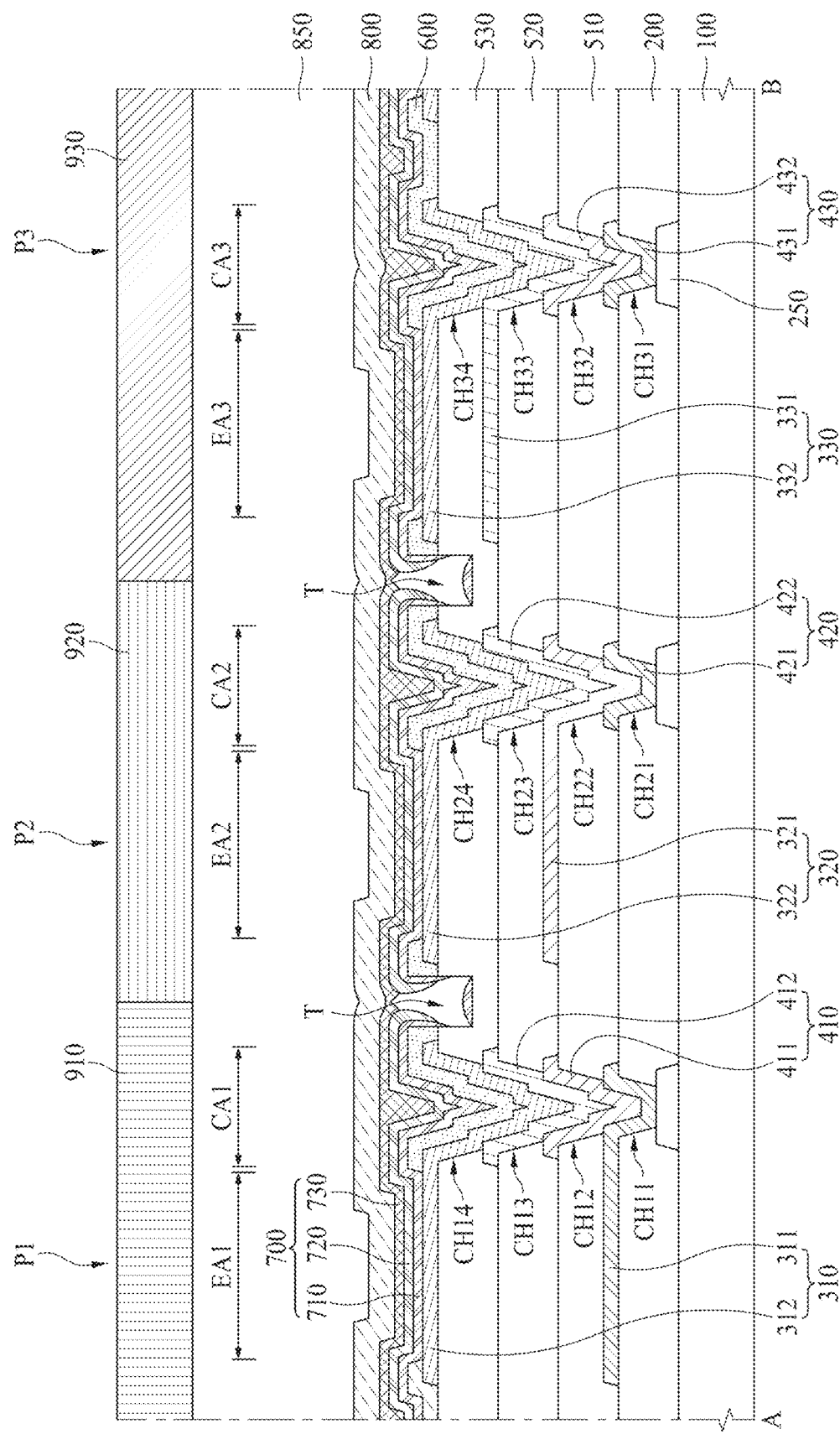
FIG. 12A is a cross-sectional view illustrating the electroluminescent display device according to an embodiment of the present disclosure, which corresponds to a cross-sectional view along line A-B of FIG. 11.

FIG. 12A is a cross-sectional view illustrating the electroluminescent display device according to an embodiment of the present disclosure, which corresponds to a cross-sectional view along line A-B of FIG. 11.

As shown in the example of FIG. 12A, the electroluminescent display device according to an embodiment of the present disclosure may include the substrate 100, a circuit device layer 200, the first electrode 310, 320, and 330, the contact electrode 410, 420, and 430, an insulating layer 510, 520 and 530, the bank 600, a trench (T), an emission layer 700, a second electrode 800, an encapsulation layer 850, and a color filter layer 910, 920, and 930. The substrate 100 in FIG. 12 is substantially similar to the above-described examples, and a detailed description for the substrate 100 will be omitted.

In a similar manner as above, the circuit device layer 200 may include a circuit device including various signal lines, thin-film transistors, and a capacitor, and the circuit device may be provided for each subpixel (P1, P2, P3). In FIG. 12A, reference number 250 corresponds to a driving thin-film transistor in the circuit device layer 200.

In the circuit device layer 200, the first contact hole (CH11, CH21, CH31) may be provided for each subpixel (P1, P2, P3). A source terminal or drain terminal of the driving thin-film transistor 250 may be exposed via the first contact hole (CH11, CH21, CH31).

The first electrode 310, 320, and 330 and the contact electrode 410, 420, and 430 may be patterned for each subpixel (P1, P2, P3) on the circuit device layer 200. One first electrode 310 and the first contact electrode 410 may be in the first subpixel (P1), another first electrode 320 and the second contact electrode 420 may be in the second subpixel (P2), and another first electrode 330 and the third contact electrode 430 may be in the third subpixel (P3).

The first electrode 310, 320, and 330 may be connected to the driving thin-film transistor 250 in the circuit device layer 200. For example, the first electrode 310, 320, and 330 may be connected to the source terminal or drain terminal of the driving thin-film transistor 250.

The first electrode 310 in the first subpixel (P1) may include a first lower electrode 311 and a first upper electrode 312. The first lower electrode 311 and the first upper electrode 312 may extend from the first emission area (EA1) to the first contact area (CA1).

The first lower electrode 311 may be connected to the driving thin-film transistor 250 via the first contact hole (CH11) of the circuit device layer 200 in the first subpixel (P1). Depending on the case, the first bottom electrode 311 may be connected to the driving TFT 250 through a conductive material filled into the first contact hole CH11, and this may be identically applied to all of the following embodiments. The first upper electrode 312 may be connected to the first upper contact electrode 412 in the first contact electrode 410 via the fourth contact hole (CH14) of the third insulating layer 530 in the first subpixel (P1).

The first contact electrode 410 in the first subpixel (P1) may include a first lower contact electrode 411 and the first upper contact electrode 412. The first lower contact electrode 411 may be connected to the first lower electrode 311 via the second contact hole (CH12) of the first insulating layer 510 in the first subpixel (P1). The first upper contact electrode 412 may be connected to the first lower contact electrode 411 via the third contact hole (CH13) of the second insulating layer 520 in the first subpixel (P1).

In the first subpixel (P1), the first lower electrode 311 may be directly connected to the driving thin-film transistor 250 in the circuit device layer 200, and the first upper electrode 312 may be connected to the first lower electrode 311 through the first lower contact electrode 411 and the first upper contact electrode 412. Accordingly, the first insulating layer 510, the second insulating layer 520 and the third insulating layer 530 may be between the first lower electrode 311 and the first upper electrode 312 in the first emission area (EA1) of the first subpixel (P1).

The first electrode 320 in the second subpixel (P2) may include a second lower electrode 321 and a second upper electrode 322. The second lower electrode 321 and the second upper electrode 322 may extend from the second emission area (EA2) to the second contact area (CA2).

The second lower electrode 321 may be connected to a second lower contact electrode 421 in the second contact electrode 420 via the second contact hole (CH22) of the first insulating layer 510 in the second subpixel (P2). The second upper electrode 322 may be connected to a second upper contact electrode 422 in the second contact electrode 420 via the fourth contact hole (CH24) of the third insulating layer 530 in the second subpixel (P2).

The second contact electrode 420 in the second subpixel (P2) may include the second lower contact electrode 421 and the second upper contact electrode 422. The second lower contact electrode 421 may be connected to the driving thin-film transistor 250 via the first contact hole (CH21) of the circuit device layer 200 in the second subpixel (P2). The second upper contact electrode 422 may be connected to the second lower electrode 321 via the third contact hole (CH23) of the second insulating layer 520 in the second subpixel (P2). Depending on the case, the second bottom contact electrode 421 may be connected to the driving TFT 250 through a conductive material filled into the first contact hole CH21, and this may be identically applied to all of the following embodiments.

In the second subpixel (P2), the second lower electrode 321 may be directly connected to the driving thin-film transistor 250 in the circuit device layer 200 through the second lower contact electrode 421, and the second upper electrode 322 may be connected to the second lower electrode 321 through the second upper contact electrode 422. Accordingly, the second insulating layer 520 and the third insulating layer 530 may be between the second lower electrode 321 and the second upper electrode 322 in the second emission area (EA2) of the second subpixel (P2).

The first electrode 330 in the third subpixel (P3) may include a third lower electrode 331 and a third upper electrode 332. The third lower electrode 331 and the third upper electrode 332 may extend from the third emission area (EA3) to the third contact area (CA3).

The third lower electrode 331 may be connected to a third upper contact electrode 432 in the third contact electrode 430 via the third contact hole (CH33) of the second insulating layer 520 in the third subpixel (P3). The third upper electrode 332 may be connected to the third lower electrode 331 via the fourth contact hole (CH34) of the third insulating layer 530 in the third subpixel (P3).

The third contact electrode 430 in the third subpixel (P3) may include a third lower contact electrode 431 and the third upper contact electrode 432. The third lower contact electrode 431 may be connected to the driving thin-film transistor 250 via the first contact hole (CH31) of the circuit device layer 200 in the third subpixel (P3). The third upper contact electrode 432 may be connected to the third lower contact electrode 431 via the second contact hole (CH32) of the first insulating layer 510 in the third subpixel (P3).

In the third subpixel (P3), the third lower electrode 331 may be connected to the driving thin-film transistor 250 in the circuit device layer 200 through the third lower contact electrode 431 and the third upper contact electrode 432, and the third upper electrode 332 may be directly connected to the second lower electrode 321. Accordingly, the third insulating layer 530 may be between the second lower electrode 321 and the second upper electrode 322 in the third emission area (EA3) of the third subpixel (P3). Depending on the case, the third bottom contact electrode 431 may be connected to the driving TFT 250 through a conductive material filled into the first contact hole CH31, and this may be identically applied to all of the following embodiments.

Thus, according to an embodiment of the present disclosure, a distance between the first lower electrode 311 and the first upper electrode 312 in the first subpixel (P1), a distance between the second lower electrode 321 and the second upper electrode 322 in the second subpixel (P2), and a distance between the third lower electrode 331 and the third upper electrode 332 in the third subpixel (P3) may be different from one another so that it may be possible to obtain a micro-cavity effect. This will be described later in detail.

The first insulating layer 510 may be provided on the circuit device layer 200. For example, the first insulating layer 510 may be below the first lower contact electrode 411, the second lower electrode 321, and the third upper contact electrode 432. In the first insulating layer 510, the second contact hole (CH12, CH22, CH32) may be respectively provided for each subpixel (P1, P2, P3). The first insulation layer 510 may be provided all over the plurality of subpixels P1 to P3 area except the second contact holes CH12, CH22, and CH32, and thus, the first insulation layer 510 provided in the first subpixel P1, the second insulation layer 510 provided in the second subpixel P2, and the first insulation layer 510 provided in the third subpixel P3 may be connected to one another.

The second insulating layer 520 may be provided on the first insulating layer 510. For example, the second insulating layer 520 may be below the first upper contact electrode 412, the second upper contact electrode 422, and the third lower electrode 331. In the second insulating layer 520, the third contact hole (CH13, CH23, CH33) may be respectively provided for each subpixel (P1, P2, P3). The second insulation layer 520 may be provided all over the plurality of subpixels P1 to P3 area except the third contact holes CH13, CH23, and CH33, and thus, the second insulation layer 520 provided in the first subpixel P1, the second insulation layer 520 provided in the second subpixel P2, and the second insulation layer 520 provided in the third subpixel P3 may be connected to one another.

The third insulating layer 530 may be provided on the second insulating layer 520. For example, the third insulating layer 530 may be below the first upper electrode 312, the second upper electrode 322, and the third upper electrode 332. In the third insulating layer 530, the fourth contact hole (CH14, CH24, CH34) may be respectively provided for each subpixel (P1, P2, P3). The third insulation layer 530 may be provided all over the plurality of subpixels P1 to P3 area except the fourth contact holes CH14, CH24, and CH34, and thus, the third insulation layer 530 provided in the first subpixel P1, the third insulation layer 530 provided in the second subpixel P2, and the third insulation layer 530 provided in the third subpixel P3 may be connected to one another.

The electroluminescent display device according to an embodiment of the present disclosure may be formed in a top-emission type. For example, the first electrode 310, 320, and 330 may be configured to upwardly reflect light emitted from the emission layer 700. For example, each of the first electrode 310, 320, and 330 may be formed in a dual-layered structure, including the lower-positioned first to third lower electrodes 311, 321, and 331 corresponding to a reflective electrode, and the upper-positioned first to third upper electrodes 312, 322, and 332 corresponding to a transparent or semi-transparent electrode. For example, the first to third upper electrodes 312, 322, and 332 may function as respective anodes of the first to third subpixels (P1, P2, P3).

In embodiments according to the present disclosure, the reflective electrode may be the electrode configured to reflect the incident light, the transparent electrode may be the electrode configured to transmit the incident light, and the semi-transparent electrode may be the electrode configured to reflect some of the incident light and to transmit the remaining light. In the aspect of transparency, the transparent electrode, the semi-transparent electrode, and the reflective electrode may be sequentially ranked in the order of excellence of transparency. In the aspect of reflectance, the reflective electrode, the semi-transparent electrode, and the transparent electrode may be sequentially ranked in the order of excellence of reflectance.

For example, the second lower contact electrode 421 of the second subpixel (P2) and the third lower contact electrode 431 of the third subpixel (P3), which may be in the same layer as the first lower electrode 311 of the first subpixel (P1), may include the same material as that of the first lower electrode 311, and may be also patterned by the same process as that of the first lower electrode 311. Also, the first lower contact electrode 411 of the first subpixel (P1) and the third upper contact electrode 432 of the third subpixel (P3), which may be in the same layer as that of the second lower electrode 321 of the second subpixel (P2), may include the same material as that of the second lower electrode 321, and may be also patterned by the same process as that of the second lower electrode 321.

Also, the first upper contact electrode 412 of the first subpixel (P1) and the second upper contact electrode 422 of the second subpixel (P2), which may be in the same layer as the third lower electrode 331 of the third subpixel (P3), may include the same material as that of the third lower electrode 331, and may be also patterned by the same process as that of the third lower electrode 331. Also, the first upper electrode 312 of the first subpixel (P1), the second upper electrode 322 of the second subpixel (P2), and the third upper electrode 332 of the third subpixel (P3), which may be in the same layer, may include the same material, and may be patterned by the same process.

When the first to third lower electrodes 311, 321, and 331 include the reflective electrodes, and the first to third upper electrodes 312, 322, and 332 include the transparent electrodes, some of the light emitted from the emission layer 700 may be reflected on the first to third lower electrodes 311, 321, and 331, and may then be transmitted through the first to third upper electrodes 311, 322 and 332, and may then be advanced upwardly.

When the first to third lower electrodes 311, 321, and 331 include the reflective electrodes, and the first to third upper electrodes 312, 322, and 332 include the semi-transparent electrodes, some of the light emitted from the emission layer 700 may be reflected on the first to third upper electrodes 312, 322, and 332, and may then be advanced upwardly; and some other of the light emitted from the emission layer 700 may be transmitted through the first to third upper electrodes 312, 322, and 332, and may then be advanced downwardly, and may then be reflected on the first to third lower electrodes 311, 321, and 331. For example, some of the light reflected on the first to third lower electrodes 311, 321, and 331 may be transmitted through the first to third upper electrodes 312, 322, and 332, and may then be advanced upwardly; and some other of the light reflected on the first to third lower electrodes 311, 321, and 331 may be reflected on the first to third upper electrodes 312, 322, and 332, and may then be advanced downwardly, and may then be re-reflected on the first to third lower electrodes 311, 321, and 331. The above processes may be repeated. As described above, the light may be amplified by the repetitive reflection and re-reflection between the first to third lower electrodes 311, 321, and 331 and the first to third upper electrodes 312, 322, and 332 to improve light efficiency.

For example, when the distance between the first to third lower electrodes 311, 321, and 331 and the first to third upper electrodes 312, 322, and 332 becomes an integer multiple of half-wavelength ($\lambda/2$) of the light emitted from each subpixel (P1, P2, P3), a constructive interference may occur, and the light may be more amplified. The above process of reflection and re-reflection may be repeated so that the light amplification may be continuously increased, thereby improving an external extraction efficiency of the light. This property may be referred to as a "micro-cavity" property.

Thus, according to an embodiment of the present disclosure, the first distance between the first lower electrode 311 and the first upper electrode 312 in the first subpixel (P1), the second distance between the second lower electrode 321 and the second upper electrode 322 in the second subpixel (P2), and the third distance between the third lower electrode 331 and the third upper electrode 332 in the third subpixel (P3) may be differently configured by the first contact electrode 410, the second contact electrode 420, and the third contact electrode 430 so that it may be possible to obtain a micro-cavity effect in each subpixel (P1, P2, P3). For example, the first distance of the first subpixel (P1) configured to emit red (R) light corresponding to a long wavelength range may be the largest, and the third distance of the third subpixel (P3) configured to emit blue (B) light corresponding to a short wavelength range may be the smallest, but embodiments are not limited thereto.

Also, according to an embodiment of the present disclosure, a distance between the second electrode 800 and the first to third upper electrodes 312, 322, and 332 may be identically applied to all the plurality of subpixels (P1, P2, P3), and the first to third upper electrodes 312, 322, and 332 may be formed at the same height on the third insulating layer 530. Thus, a lower surface of the emission layer 700 on the first to third upper electrodes 312, 322, and 332 may have a uniform height so that it may be possible to improve a profile of the emission layer 700 in comparison when the first to third upper electrodes 312, 322, and 332 have different heights. Hereinafter, in various embodiments, the distances between the first to third top electrodes 312, 322, and 332 and the second electrode 800 may be the same in the respective subpixels P1 to P3, and the first to third top electrodes 312, 322, and 332 may be provided at the same height on the third insulation layer 530. However, embodiments of the present disclosure are not limited thereto.

The bank 600 may cover ends of the first to third upper electrodes 312, 322, and 332 included in the first electrode 310, 320, and 330 on the third insulating layer 530, and it may be possible to reduce or prevent a current from being concentrated on the ends of the first to third upper electrodes 312, 322 and 322, to reduce or prevent lowering of emission efficiency. The bank 600 may be provided as a matrix configuration in the boundary between each of the plurality of subpixels (P1, P2, P3), and may be configured to define an emission area (EA1, EA2, EA3) in each individual subpixel (P1, P2, P3). For example, an exposed area of the first to third upper electrode 312, 322, and 332, which may be exposed without being covered by the bank 600 in each subpixel (P1 P2, P3), may become the emission area (EA1, EA2, EA3).

For example, the bank 600 may overlap the contact area (CA1, CA2, CA3) in which the contact electrode 410, 420, and 430 may be provided. The stepped contact area (CA1, CA2, CA3) may not overlap the emission area (EA1, EA2, EA3).

Although not shown, the bank 600 may be patterned for each subpixel (P1, P2, P3), as described in the example of FIG. 8. The structure of the bank 600 patterned for each subpixel (P1, P2, P3) may be similarly applied to the following embodiments to be described later.

The trench (T), the emission layer 700, the second electrode 800, the encapsulation layer 850, and the color filter layer 910, 920, and 930 are substantially similar to those of the above embodiments of the present disclosure, and a detailed description for the same parts will be omitted. The trench (T) may extend to a predetermined area of the third insulating layer 530 through the bank 600 as illustrated, but the trench T may be provided in only the bank 600. Alternatively, the trench T may extend to the bank 600 and the third insulation layer 530, and moreover, may extend to an inner portion of a second insulation layer 520 thereunder, an inner portion of a first insulation layer 510 thereunder, or an inner portion of a circuit device layer 200 thereunder.

Figure 12B:
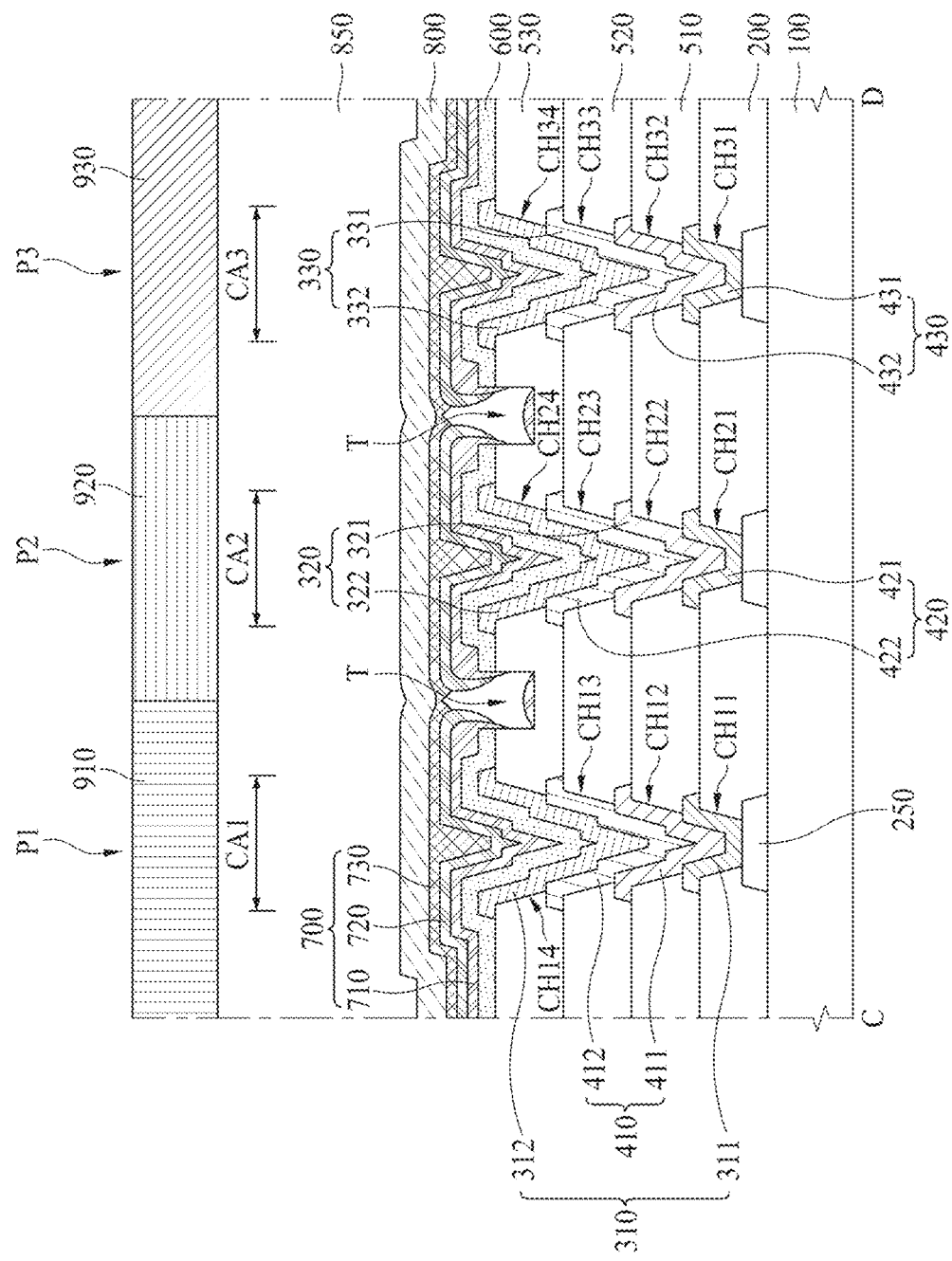
FIG. 12B is a cross-sectional view illustrating the electroluminescent display device according to an embodiment of the present disclosure, which corresponds to a cross-sectional view along line C-D of FIG. 11.

FIG. 12B is a cross-sectional view illustrating the electroluminescent display device according to an embodiment of the present disclosure, which corresponds to a cross-sectional view along line C-D of FIG. 11.

For example, FIG. 12B is a cross-sectional view illustrating the plurality of contact areas (CA1, CA2, CA3). As shown in FIG. 12B, the circuit device layer 200, including the driving thin-film transistor 250, may be provided on the substrate 100. In the circuit device layer 200, the first contact hole (CH11, CH21, CH31) may be provided for each subpixel (P1, P2, P3), and the source terminal or drain terminal of the driving thin-film transistor 250 may be exposed via the first contact hole (CH11, CH21, CH31).

The first lower electrode 311 may be in the first subpixel (P1) on the circuit device layer 200, the second lower contact electrode 421 may be in the second subpixel (P2) on the circuit device layer 200, and the third lower contact electrode 431 may be in the third subpixel (P3) on the circuit device layer 200. The first lower electrode 311, the second lower contact electrode 421, and the third lower contact electrode 431 may be connected to the source terminal or drain terminal of the driving thin-film transistor 250 via the first contact hole (CH11, CH21, CH31).

The first insulating layer 510 may be on the first lower electrode 311, the second lower contact electrode 421, and the third lower contact electrode 431. The second contact hole (CH12, CH22, CH32) may be provided in the first insulating layer 510.

The first lower contact electrode 411 may be in the first subpixel (P1) on the first insulating layer 510, the second lower electrode 321 may be in the second subpixel (P2) on the first insulating layer 510, and the third upper contact electrode 432 may be in the third subpixel (P3) on the first insulating layer 510.

The first lower contact electrode 411 may be connected (e.g., electrically connected) to the first lower electrode 311 via the second contact hole (CH12). The second lower electrode 321 may be connected (e.g., electrically connected) to the second lower contact electrode 421 via the second contact hole (CH22). The third upper contact electrode 432 may be connected (e.g., electrically connected) to the third lower contact electrode 431 via the second contact hole (CH32).

The second insulating layer 520 may be on the first lower contact electrode 411, the second lower electrode 321, and the third upper contact electrode 432. The third contact hole (CH13, CH23, CH33) may be provided in the second insulating layer 520.

The first upper contact electrode 412 may be in the first subpixel (P1) on the second insulating layer 520. The second upper contact electrode 422 may be in the second subpixel (P2) on the second insulating layer 520. The third lower electrode 331 may be in the third subpixel (P3) on the second insulating layer 520.

The first upper contact electrode 412 may be connected (e.g., electrically connected) to the first lower contact electrode 411 via the third contact hole (CH13). The second upper contact electrode 422 may be connected (e.g., electrically connected) to the second lower electrode 321 via the third contact hole (CH23). The third lower electrode 331 may be connected (e.g., electrically connected) to the third upper contact electrode 432 via the third contact hole (CH33).

The third insulating layer 530 may be on the first upper contact electrode 412, the second upper contact electrode 422. The third lower electrode 331, and the fourth contact hole (CH14, CH24, CH34) may be provided in the third insulating layer 530.

The first upper electrode 312 may be in the first subpixel (P1) on the third insulating layer 530. The second upper electrode 322 may be in the second subpixel (P2) on the third insulating layer 530. The third upper electrode 332 may be in the third subpixel (P3) on the third insulating layer 530.

The first upper electrode 312 may be connected (e.g., electrically connected) to the first upper contact electrode 412 via the fourth contact hole (CH14). The second upper electrode 322 may be connected (e.g., electrically connected) to the second upper contact electrode 422 via the fourth contact hole (CH24). The third upper electrode 332 may be connected (e.g., electrically connected) to the third lower electrode 331 via the fourth contact hole (CH34).

The bank 600 may be on the first upper electrode 312, the second upper electrode 322, and the third upper electrode 332, and may cover both ends of each of the first upper electrode 312, the second upper electrode 322, and the third upper electrode 332. The emission layer 700 may be on the bank 600. The second electrode 800 may be on the emission layer 700. The encapsulation layer 850 may be on the second electrode 800. The color filter layer 910, 920, and 930 may be formed on the encapsulation layer 850.

Figure 12C:
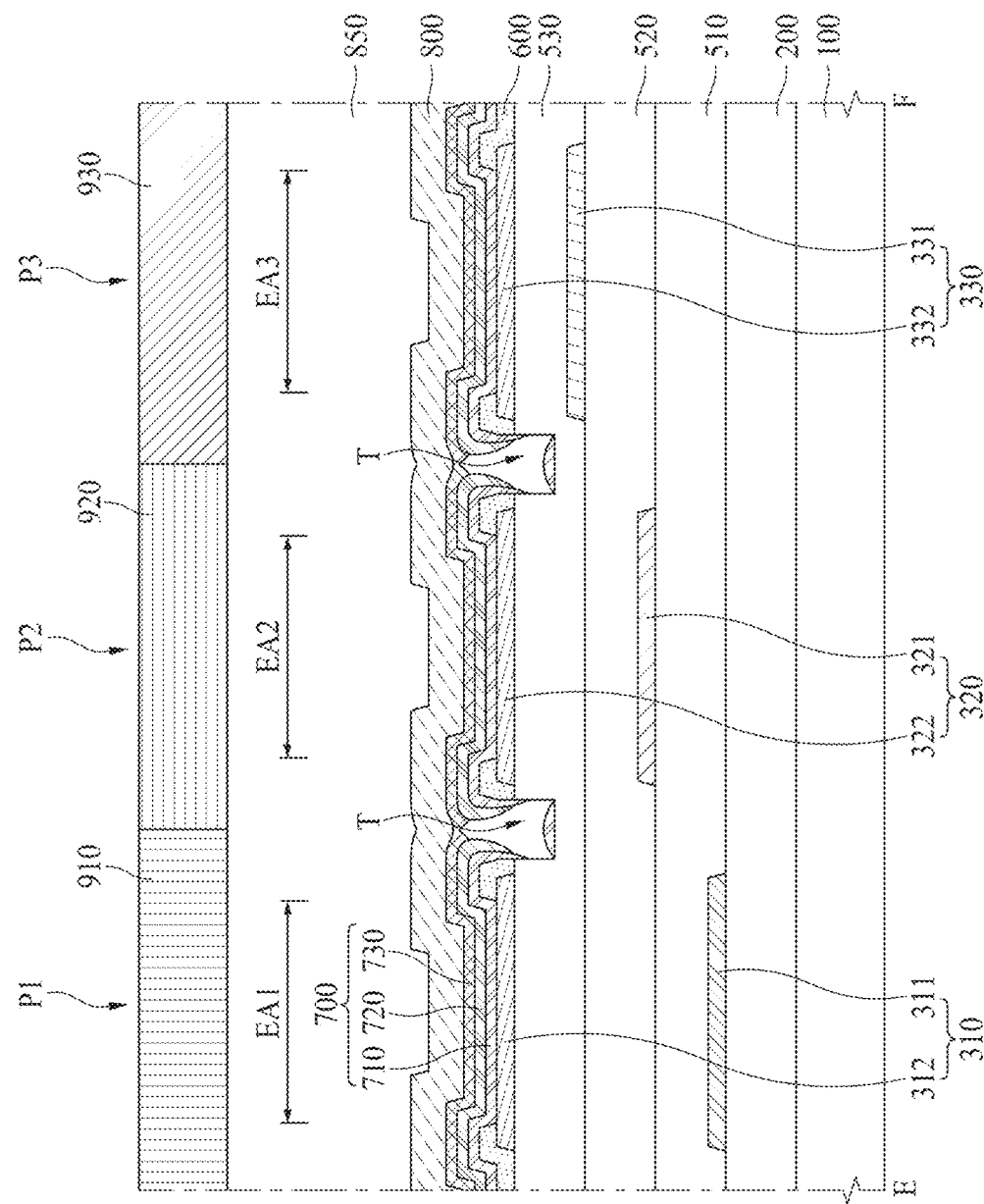
FIG. 12C is a cross-sectional view illustrating the electroluminescent display device according to an embodiment of the present disclosure, which corresponds to a cross-sectional view along line E-F of FIG. 11.

FIG. 12C is a cross-sectional view illustrating the electroluminescent display device according to an embodiment of the present disclosure, which corresponds to a cross-sectional view along line E-F of FIG. 11.

For example, FIG. 12C is a cross-sectional view illustrating the plurality of emission areas (EA1, EA2, EA3). As shown in FIG. 12C, the circuit device layer 200 may be on the substrate 100, and the first lower electrode 311 may be in the first subpixel (P1) on the circuit device layer 200.

The first insulating layer 510 may be on the first lower electrode 311. The second lower electrode 321 may be in the second subpixel (P2) on the first insulating layer 510.

The second insulating layer 520 may be on the second lower electrode 321. The third lower electrode 331 may be in the third subpixel (P3) on the second insulating layer 520.

The third insulating layer 530 may be on the third lower electrode 331. The first upper electrode 312 may be in the first subpixel (P1) on the third insulating layer 530. The second upper electrode 332 may be in the second subpixel (P2) on the third insulating layer 530. The third upper electrode 332 may be in the third subpixel (P3) on the third insulating layer 530.

The bank 600 may be on the first upper electrode 312, the second upper electrode 322, and the third upper electrode 332, and may cover both ends of the respective first upper electrode 312, the second upper electrode 322, and the third upper electrode 332. The emission layer 700 may be on the bank 600. The second electrode 800 may be on the emission layer 700. The encapsulation layer 850 may be on the second electrode 800. The color filter layer 910, 920, and 930 may be on the encapsulation layer 850.

Figure 13:
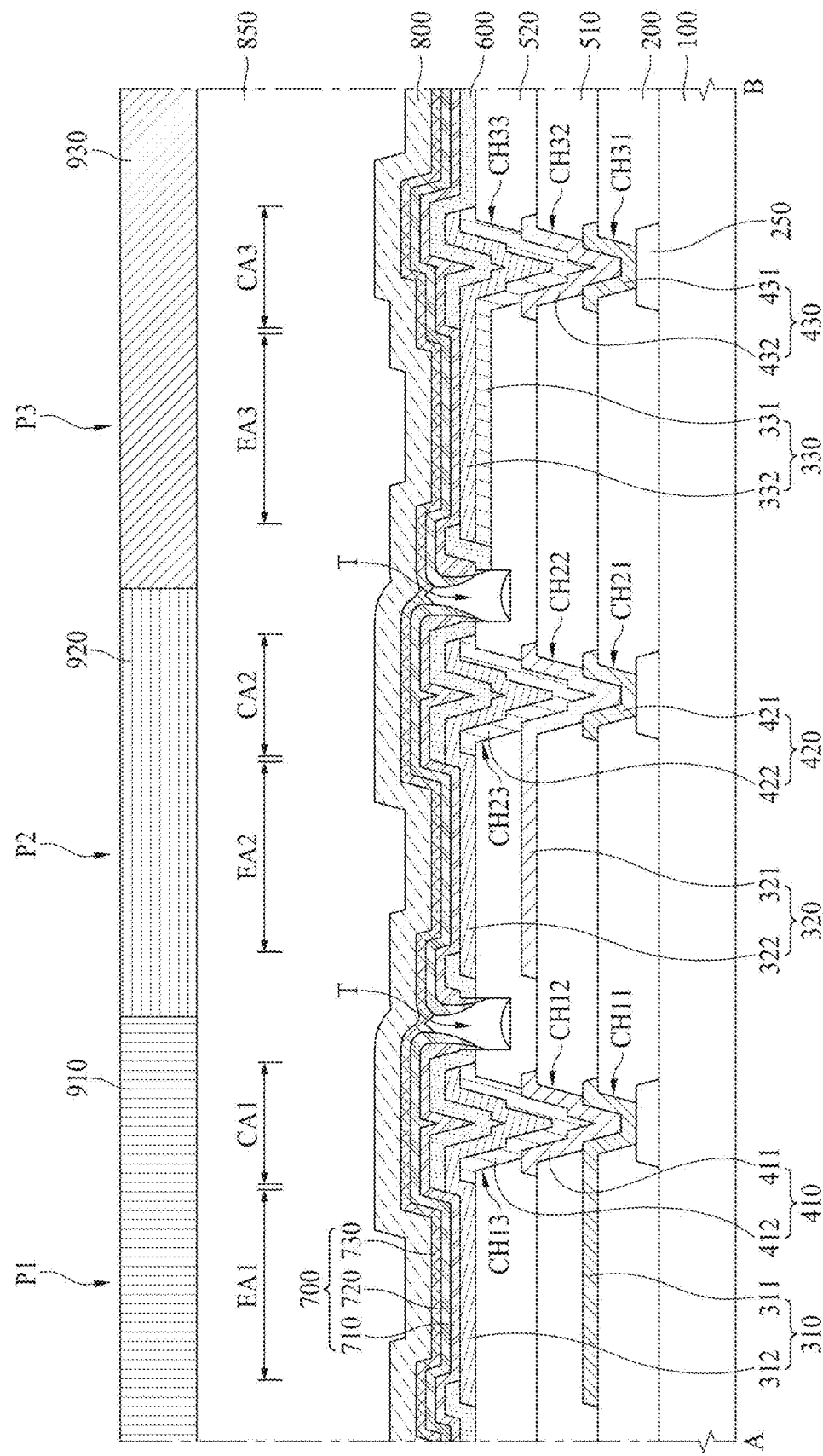
FIG. 13 is a cross-sectional view illustrating an electroluminescent display device according to an embodiment of the present disclosure, which corresponds to a cross-sectional view along line A-B of FIG. 11.

FIG. 13 is a cross-sectional view illustrating an electroluminescent display device according to an embodiment of the present disclosure, which corresponds to a cross-sectional view along line A-B of FIG. 11.

A third insulating layer 530 is not provided in the electroluminescent display device of the FIG. 13 example, which is different from the electroluminescent display device of the FIG. 12A example. The same reference numbers will be used throughout the drawings to refer to the same or like parts, and only the different structures will be described.

As shown in FIG. 13, according to an embodiment of the present disclosure, a first upper electrode 312 of a first electrode 310 may be provided directly on an upper surface of a first upper contact electrode 412 of a first contact electrode 410 in a first subpixel (P1) without using an additional insulating layer. A second upper electrode 322 of a first electrode 320 may be provided directly on an upper surface of a second upper contact electrode 422 of a second contact electrode 420 in a second subpixel (P2) without using an additional insulating layer. A third upper electrode 332 of a first electrode 330 may be provided directly on an upper surface of a third lower electrode 331 of the first electrode 330 in a third subpixel (P3) without using an insulating layer.

Accordingly, a first insulating layer 510 and a second insulating layer 520 may be provided between the first lower electrode 311 and the first upper electrode 312 in a first emission area (EA1) of the first subpixel (P1). The second insulating layer 520 may be provided between the second lower electrode 321 and the second upper electrode 332 in a second emission area (EA2) of the second subpixel (P2). An additional insulating layer may not be provided between the third lower electrode 331 and the third upper electrode 332 in a third emission area (EA3) of the third subpixel (P3).

A distance between the first lower electrode 311 and the first upper electrode 312 in the first emission area (EA1) of the first subpixel (P1) in the structure of FIG. 13 may be shorter than the distance between the first lower electrode 311 and the first upper electrode 312 in the first emission area (EA1) of the first subpixel (P1) in the structure of FIG. 12A. Also, a distance between the second lower electrode 321 and the second upper electrode 322 in the second emission area (EA2) of the second subpixel (P2) in the structure of FIG. 13 may be shorter than the distance between the second lower electrode 321 and the second upper electrode 322 in the second emission area (EA2) of the second subpixel (P2) in the structure of FIG. 12A. Also, a distance between the third lower electrode 331 and the third upper electrode 332 in the third emission area (EA3) of the third subpixel (P3) in the structure of FIG. 13 may be shorter than the distance between the third lower electrode 331 and the third upper electrode 332 in the third emission area (EA3) of the third subpixel (P3) in the structure of FIG. 12A.

As described above, to obtain a micro-cavity effect in the individual subpixel (P1, P2, P3), the distance between the first to third lower electrodes 311, 321, and 331 and the first to third upper electrodes 312, 322, and 332 may become an integer multiple of half-wavelength ($\lambda/2$) of the light emitted from each subpixel (P1, P2, P3), for example. Thus, to realize the integer multiple of half-wavelength ($\lambda/2$) of the light, the distance between the first to third lower electrodes 311, 321, and 331 and the first to third upper electrodes 312, 322, and 332 may be changed through the structure of FIG. 12A or FIG. 13.

Figure 14:
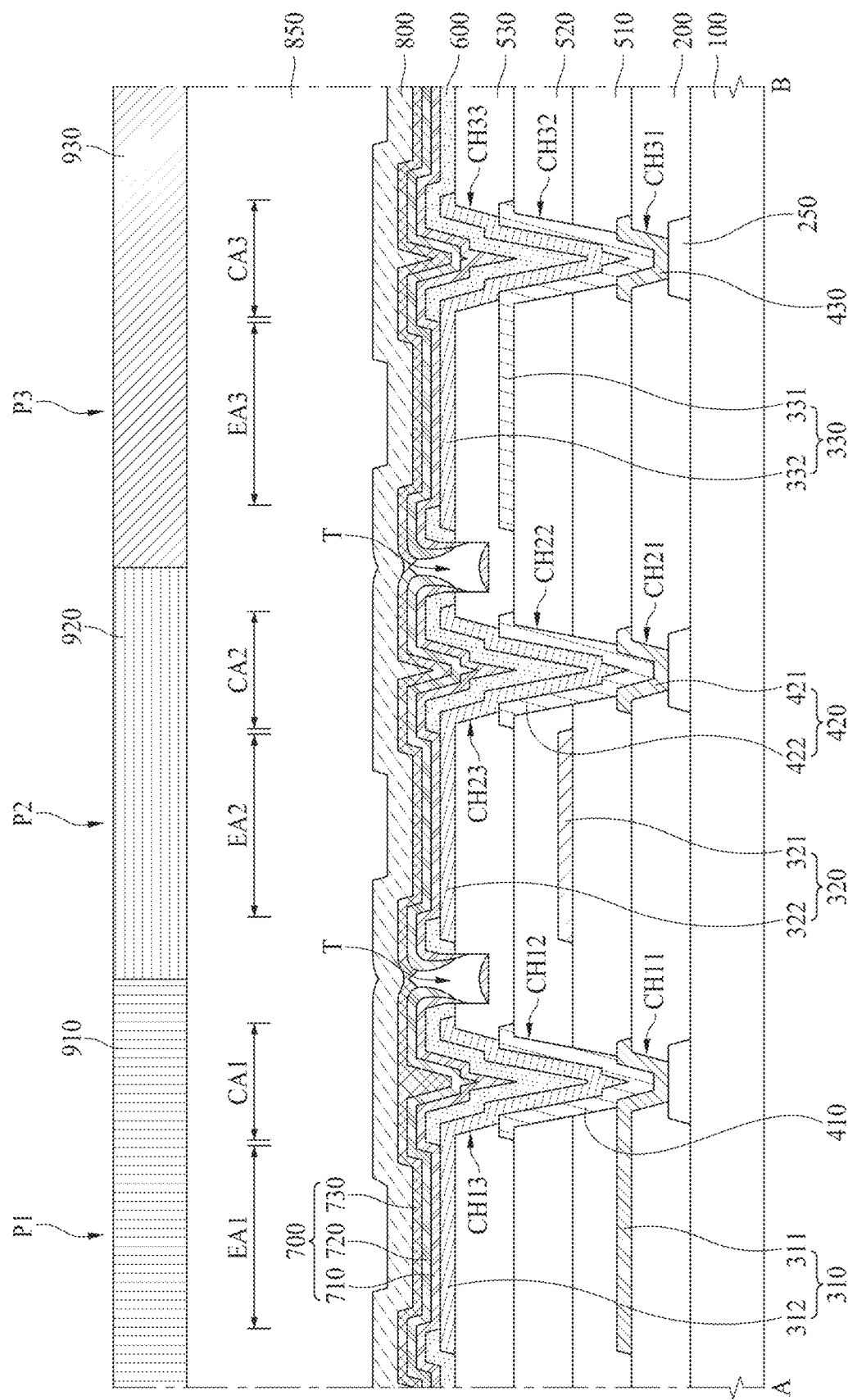
FIG. 14 is a cross-sectional view illustrating an electroluminescent display device according to an embodiment of the present disclosure, which corresponds to a cross-sectional view along line A-B of FIG. 11.

FIG. 14 is a cross-sectional view illustrating an electroluminescent display device according to an embodiment of the present disclosure, which corresponds to a cross-sectional view along line A-B of FIG. 11.

A structure of a first electrode 310, 320, and 330 and a contact electrode 410, 420, and 430 in the electroluminescent display device of the FIG. 14 example is different from that of the electroluminescent display device of the FIG. 12A example. Hereinafter, only the different structures will be described as follows.

As shown in FIG. 14, the first electrode 310, 320, and 330 and the contact electrode 410, 420, and 430 may be patterned for each subpixel (P1, P2, P3) on a circuit device layer 200. The first electrode 310 in the first subpixel (P1) may include a first lower electrode 311 and a first upper electrode 312. The first lower electrode 311 and the first upper electrode 312 may extend from a first emission area (EA1) to a first contact area (CA1).

The first lower electrode 311 may be connected (e.g., electrically connected) to a driving thin-film transistor 250 via a first contact hole (CH11) of the circuit device layer 200 in the first subpixel (P1). The first upper electrode 312 may be connected (e.g., electrically connected) to a first contact electrode 410 via a third contact hole (CH13) of a third insulating layer 530 in the first subpixel (P1).

The first contact electrode 410 in the first subpixel (P1) may include one contact layer. The first contact electrode 410 may be connected (e.g., electrically connected) to the first lower electrode 311 via a second contact hole (CH12) in a first insulating layer 510 and a second insulating layer 520 in the first subpixel (P1).

In the first subpixel (P1), the first lower electrode 311 may be directly connected to the driving thin-film transistor 250 in the circuit device layer 200, and the first upper electrode 312 may be connected to the first lower electrode 311 via the first contact electrode 410. Accordingly, the first insulating layer 510, the second insulating layer 520, and the third insulating layer 530 may be provided between the first lower electrode 311 and the first upper electrode 312 in the first emission area (EA1) of the first subpixel (P1).

The first electrode 320 in the second subpixel (P2) may include a second lower electrode 321 and a second upper electrode 322. The second lower electrode 321 may be in a second emission area (EA2), and may not extend to a second contact area (CA2). The second upper electrode 322 may extend from the second emission area (EA2) to the second contact area (CA2).

The second lower electrode 321 may be formed as an island structure on the first insulating layer 510. For example, the second lower electrode 321 may not be connected (e.g., electrically connected) to the second contact electrode 420, the second upper electrode 322, and the driving thin-film transistor 250. The second upper electrode 322 may be connected (e.g., electrically connected) to a second upper contact electrode 422 in the second contact electrode 420 via a third contact hole (CH23) of the third insulating layer 530 in the second subpixel (P2).

The second contact electrode 420 in the second subpixel (P2) may include a second lower contact electrode 421 and the second upper contact electrode 422. The second lower contact electrode 421 may be connected (e.g., electrically connected) to the driving thin-film transistor 250 via a first contact hole (CH21) of the circuit device layer 200 in the second subpixel (P2). The second upper contact electrode 422 may be connected (e.g., electrically connected) to the second lower electrode 321 via a second contact hole (CH22) of the first insulating layer 510 and the second insulating layer 520 in the second subpixel (P2).

In the second subpixel (P2), the second lower electrode 321 may be formed as an island structure, and may be not connected (e.g., electrically connected) to other conductive material. The second upper electrode 322 may be connected (e.g., electrically connected) to the driving thin-film transistor 250 through the second lower contact electrode 421 and the second upper contact electrode 422. Accordingly, the second insulating layer 520 and the third insulating layer 530 may be provided between the second lower electrode 321 and the second upper electrode 322 in the second emission area (EA2) of the second subpixel (P2).

The first electrode 330 in the third subpixel (P3) may include a third lower electrode 331 and a third upper electrode 332. The third lower electrode 331 and the third upper electrode 332 may extend from a third emission area (EA3) to a third contact area (CA3).

The third lower electrode 331 may be connected (e.g., electrically connected) to the third contact electrode 430 via a second contact hole (CH32) of the first insulating layer 510 and the second insulating layer 520 in the third subpixel (P3). The third upper electrode 332 may be connected (e.g., electrically connected) to the third lower electrode 331 via a third contact hole (CH33) of the third insulating layer 530 in the third subpixel (P3).

The third contact electrode 430 in the third subpixel (P3) may include one single contact layer. The third contact electrode 430 may be connected (e.g., electrically connected) to the driving thin-film transistor 250 via the first contact hole (CH31) of the circuit device layer 200 in the third subpixel (P3).

In the third subpixel (P3), the third lower electrode 331 may be connected (e.g., electrically connected) to the driving thin-film transistor 250 in the circuit device layer 200 through the third contact electrode 430, and the third upper electrode 332 may be directly connected to the second lower electrode 321. Thus, the third insulating layer 530 may be between the third lower electrode 331 and the third upper electrode 332 in the third emission area (EA3) of the third subpixel (P3).

The first insulating layer 510 may be provided between the circuit device layer 200 and the second insulating layer 520. For example, the first insulating layer 510 may be below the second lower electrode 321. In the first insulating layer 510, the second contact hole (CH12, CH22, CH32) may be provided for each subpixel (P1, P2, P3).

The second insulating layer 520 may be provided on the first insulating layer 510. For example, the second insulating layer 520 may be below the first contact electrode 410, the second upper contact electrode 422, and the third lower electrode 331. In the second insulating layer 520, the second contact hole (CH12, CH22, CH32) may be provided for each subpixel (P1, P2, P3).

The third insulating layer 530 may be provided on the second insulating layer 520. For example, the third insulating layer 530 may be below the first upper electrode 312, the second upper electrode 322, and the third upper electrode 332. In the third insulating layer 530, the third contact hole (CH13, CH23, CH33) may be provided for each subpixel (P1, P2, P3).

In the structure of the FIG. 12A example, the second contact hole (CH12, CH22, CH32) may be additionally provided in the first insulating layer 510, and the third contact hole (CH13, CH23, CH33) may be additionally provided in the second insulating layer 520. In the structure of the FIG. 14 example, the second contact hole (CH12, CH22, CH32) may be provided to straightly penetrate (e.g., penetrate in a straight line) through the first insulating layer 510 and the second insulating layer 520. Thus, in the example of FIG. 14, to provide the second contact hole (CH22) that straightly penetrates through the first insulating layer 510 and the second insulating layer 520 in the second subpixel (P2), the second lower electrode 321 of the first electrode 320 may not overlap the second contact area (CA2). For example, the second lower electrode 321 of the first electrode 320 in the second subpixel (P2) may not overlap the second contact electrode 420 of the second contact area (CA2). Accordingly, in comparison to the structure of the FIG. 12A example, the structure of the FIG. 14 example may be advantageous in that the number of processes for forming the contact hole may be reduced.

Figure 15:
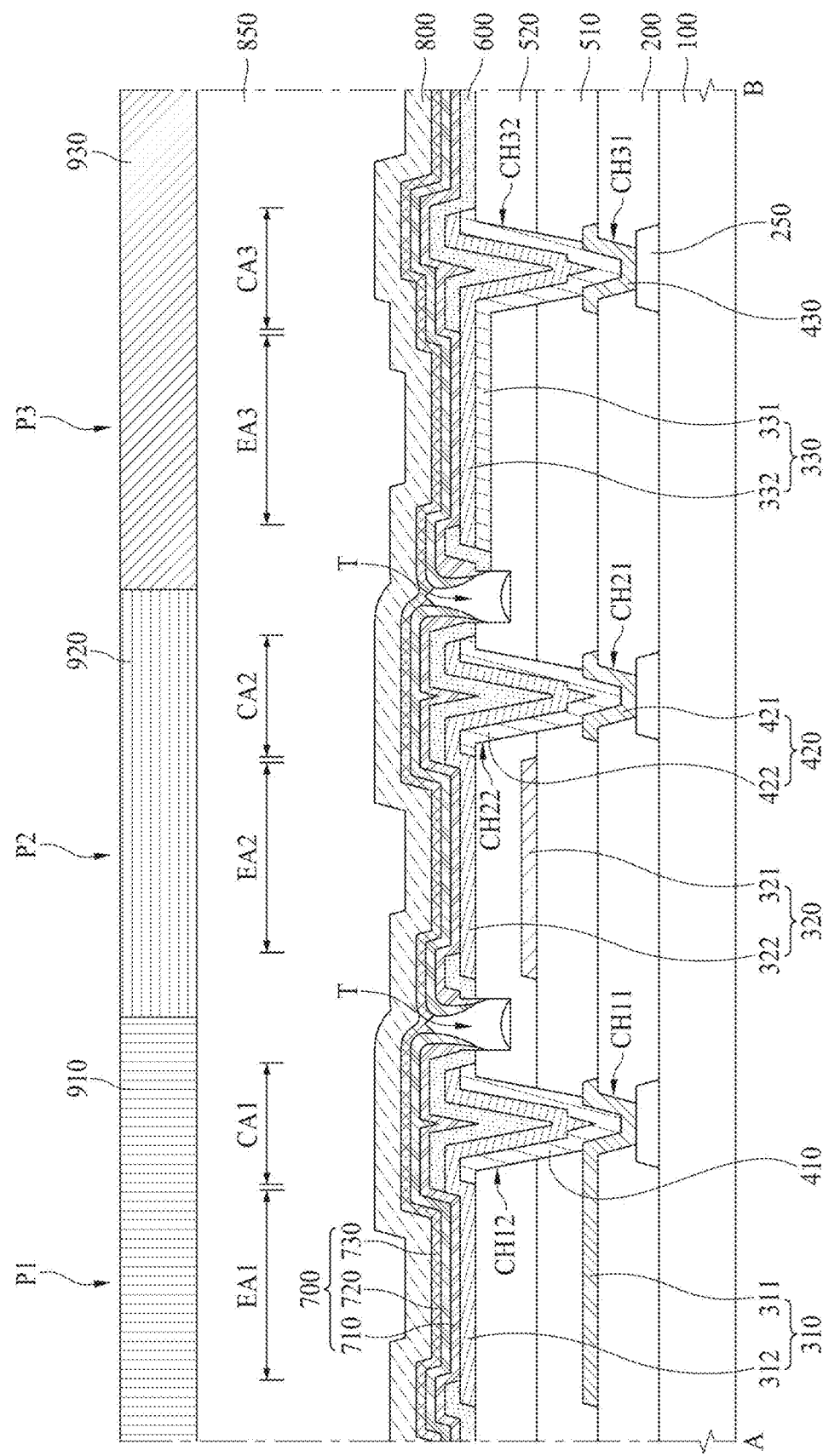
FIG. 15 is a cross-sectional view illustrating an electroluminescent display device according to an embodiment of the present disclosure, which corresponds to a cross-sectional view along line A-B of FIG. 11.

FIG. 15 is a cross-sectional view illustrating an electroluminescent display device according to an embodiment of the present disclosure, which corresponds to a cross-sectional view along line A-B of FIG. 11.

A third insulating layer 530 is not provided in the electroluminescent display device of the FIG. 15 example, which is different from the electroluminescent display device of the FIG. 14 example. Accordingly, the same reference numbers will be used throughout the drawings to refer to the same or like parts, and only the different structures will be described.

As shown in FIG. 15, according to an embodiment of the present disclosure, a first upper electrode 312 of a first electrode 310 may be provided directly on an upper surface of a first contact electrode 410 in a first subpixel (P1), without using an additional insulating layer; a second upper electrode 322 of a first electrode 320 may be provided directly on an upper surface of a second upper contact electrode 422 of a second contact electrode 420 in a second subpixel (P2), without using an additional insulating layer; and a third upper electrode 332 of a first electrode 330 may be provided directly on an upper surface of a third lower electrode 331 of the first electrode 330 in a third subpixel (P3) without using an insulating layer. Accordingly, a first insulating layer 510 and a second insulating layer 520 may be between the first lower electrode 311 and the first upper electrode 312 in a first emission area (EA1) of the first subpixel (P1), the second insulating layer 520 may be between the second lower electrode 321 and the second upper electrode 332 in a second emission area (EA2) of the second subpixel (P2), and an additional insulating layer may not be between the third lower electrode 331 and the third upper electrode 332 in a third emission area (EA3) of the third subpixel (P3).

A distance between the first lower electrode 311 and the first upper electrode 312 in the first emission area (EA1) of the first subpixel (P1) in the example structure of FIG. 15 may be shorter than the distance between the first lower electrode 311 and the first upper electrode 312 in the first emission area (EA1) of the first subpixel (P1) in the example structure of FIG. 14. Also, a distance between the second lower electrode 321 and the second upper electrode 322 in the second emission area (EA2) of the second subpixel (P2) in the structure of FIG. 15 may be shorter than the distance between the second lower electrode 321 and the second upper electrode 322 in the second emission area (EA2) of the second subpixel (P2) in the structure of FIG. 14. Also, a distance between the third lower electrode 331 and the third upper electrode 332 in the third emission area (EA3) of the third subpixel (P3) in the structure of FIG. 15 may be shorter than the distance between the third lower electrode 331 and the third upper electrode 332 in the third emission area (EA3) of the third subpixel (P3) in the structure of FIG. 14.

As described above, to obtain a micro-cavity effect in the individual subpixel (P1, P2, P3), the distance between the first to third lower electrodes 311, 321, and 331 and the first to third upper electrodes 312, 322, and 332 may become an integer multiple of half-wavelength ($\lambda/2$) of the light emitted from each subpixel (P1, P2, P3), for example. Thus, to realize the integer multiple of half-wavelength ($\lambda/2$) of the light, the distance between the first to third lower electrodes 311, 321, and 331 and the first to third upper electrodes 312, 322, and 332 may be changed, e.g., by the structure of the examples of FIG. 5 or FIG. 6.

Figure 16:
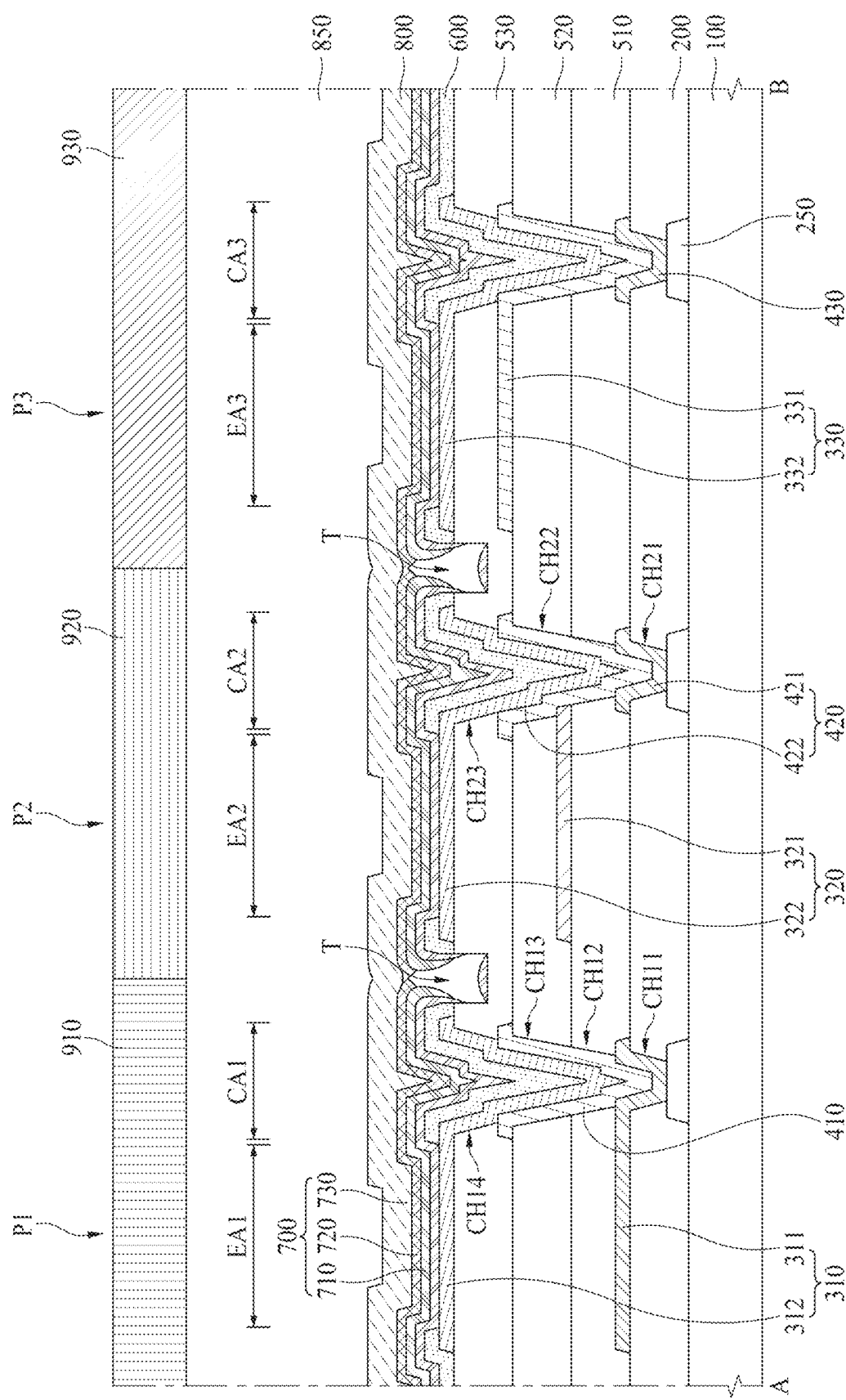
FIG. 16 is a cross-sectional view illustrating an electroluminescent display device according to an embodiment of the present disclosure, which corresponds to a cross-sectional view along line A-B of FIG. 11.

FIG. 16 is a cross-sectional view illustrating an electroluminescent display device according to an embodiment of the present disclosure, which corresponds to a cross-sectional view along line A-B of FIG. 11.

A structure of a second lower electrode 321 of a first electrode 320 in a second subpixel (P2) in the electroluminescent display device of the FIG. 16 example is different from that of the electroluminescent display device of the FIG. 14 example. Accordingly, the same reference numbers will be used throughout the drawings to refer to the same or like parts, and only the different structures will be described.

In the example of the structure of FIG. 14, the second lower electrode 321 of the first electrode 320 in the second subpixel (P2) may be formed as the island structure on the first insulating layer 510. For example, the second lower electrode 321 may not overlap the second contact area (CA2), and the second lower electrode 321 may not be connected (e.g., electrically connected) to the second contact electrode 420, the second upper electrode 322, and the driving thin-film transistor 250.

In the example structure of FIG. 16, a second lower electrode 321 of a first electrode 320 in a second subpixel (P2) may overlap a second contact area (CA2), and the second lower electrode 321 may be (e.g., electrically connected) to a second contact electrode 420, and for example, with a lateral surface of a second upper contact electrode 422 of the second contact electrode 420. In the example of FIG. 16, a second contact hole (CH22) penetrating through a first insulating layer 510 and a second insulating layer 520 may be provided in the second subpixel (P2).

In comparison to the structure of the FIG. 14 example, the structure of the FIG. 16 example may enable an increase in a size of the second lower electrode 321 of the first electrode 320 in the second subpixel (P2), e.g., to improve light efficiency. Although not shown, the structure of the FIG. 16 example may be applied to the structure of the FIG. 15 example.

Figure 17A:
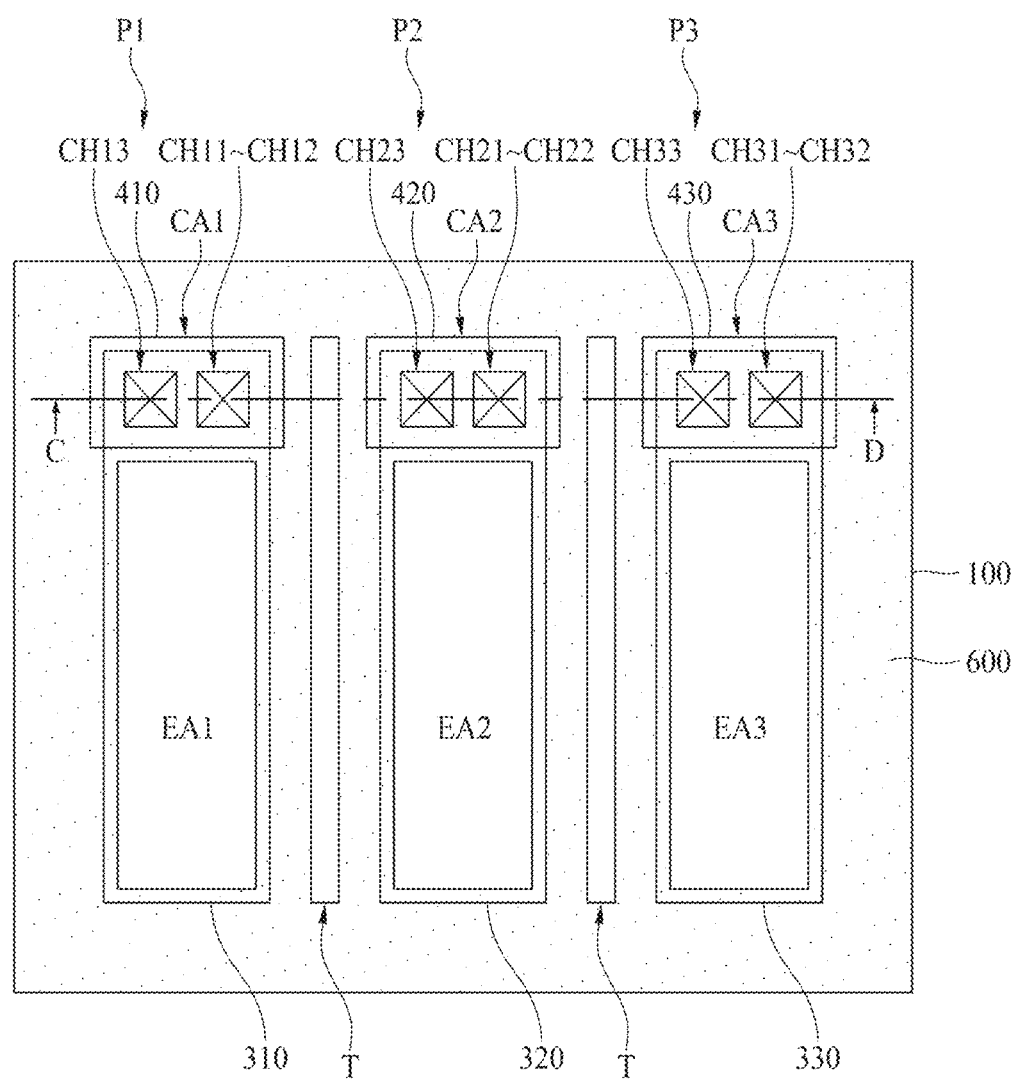
FIG. 17A is a plane view illustrating an electroluminescent display device according to an embodiment of the present disclosure
Figure 17B:
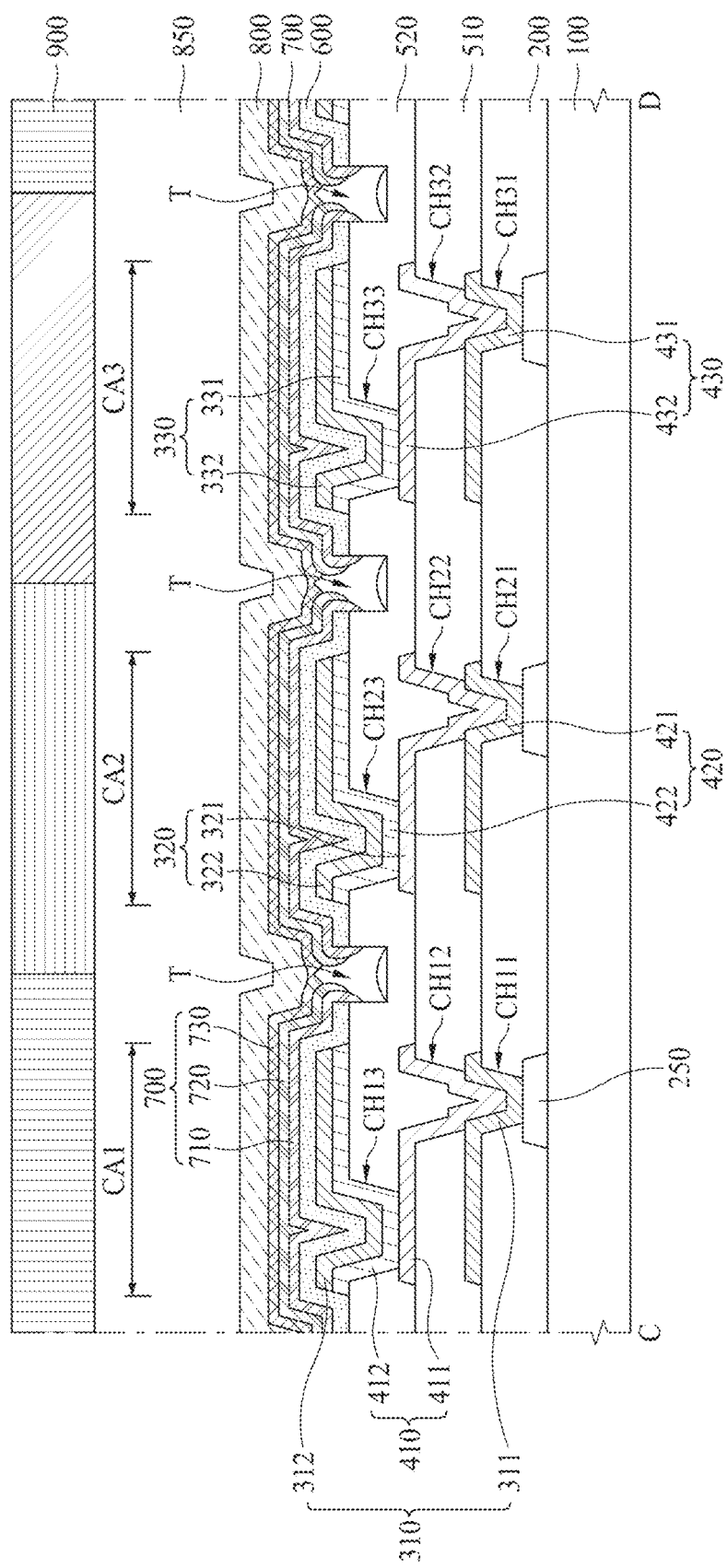

FIG. 17A is a plane view of an electroluminescent display apparatus according to an embodiment of the present disclosure. FIG. 17B is a cross-sectional view taken along line C-D of FIG. 17A.

The electroluminescent display apparatus of each of FIGS. 17A and 17B differs from the electroluminescent display apparatus of each of FIGS. 11 and 13 in that a configuration of each of a plurality of contact holes CH11 to CH13, CH21 to CH23, and CH31 to CH33 is modified. With reference to FIGS. 11 and 13 described above, the first contact hole CH11, the second contact hole CH12, and the third contact hole CH13 of the first subpixel P1 may be formed to overlap one another, the first contact hole CH21, the second contact hole CH22, and the third contact hole CH23 of the second subpixel P2 may be formed to overlap one another, and the first contact hole CH31, the second contact hole CH32, and the third contact hole CH33 of the third subpixel P3 may be formed to overlap one another.

On the other hand, with reference to FIGS. 17A and 17B, a first contact hole CH11 may overlap a second contact hole CH12, but may not overlap a third contact hole CH13 in a first subpixel P1; a first contact hole CH21 may overlap a second contact hole CH22, but may not overlap a third contact hole CH23 in a second subpixel P2; and a first contact hole CH31 may overlap a second contact hole CH32 but may not overlap a third contact hole CH33 in a third subpixel P3. Although not shown, the first contact hole CH11 may overlap the third contact hole CH13, but may not overlap the second contact hole CH12 in the first subpixel P1; the first contact hole CH21 may overlap the third contact hole CH23, but may not overlap the second contact hole CH22 in the second subpixel P2; and the first contact hole CH31 may overlap the third contact hole CH33, but may not overlap the second contact hole CH32 in the third subpixel P3. Moreover, all of the first contact hole CH11, the second contact hole CH12, and the third contact hole CH13 may not overlap in the first subpixel P1; all of the first contact hole CH21, the second contact hole CH22, and the third contact hole CH23 may not overlap in the second subpixel P2; and all of the first contact hole CH31, the second contact hole CH32, and the third contact hole CH33 may not overlap in the third subpixel P3.

Comparing with a case in which all of the first contact holes CH11, CH21, and CH31, the second contact holes CH12, CH22, and CH32, and the third contact holes CH13, CH23, and CH33 overlap, when at least one contact hole does not overlap the other contact holes, a process of forming the contact holes CH11 to CH13, CH21 to CH23, and CH31 to CH33 may be easily performed and a size of each of the contact holes CH11 to CH13, CH21 to CH23, and CH31 to CH33 may be reduced. A structure of each of the contact holes CH11 to CH13, CH21 to CH23, and CH31 to CH33 illustrated in FIGS. 17A and 17B may be applied to the structure of each of FIGS. 12A to 12C, 14, and 16 described above. In this case, in FIGS. 12A to 12C, 14, and 16, fourth contact holes CH14, CH24, and CH34 may overlap or not overlap at least one of the first contact holes CH11, CH21, and CH31, the second contact holes CH12, CH22, and CH32, and the third contact holes CH13, CH23, and CH33 in the same subpixels P1 to P3.

Figure 18:
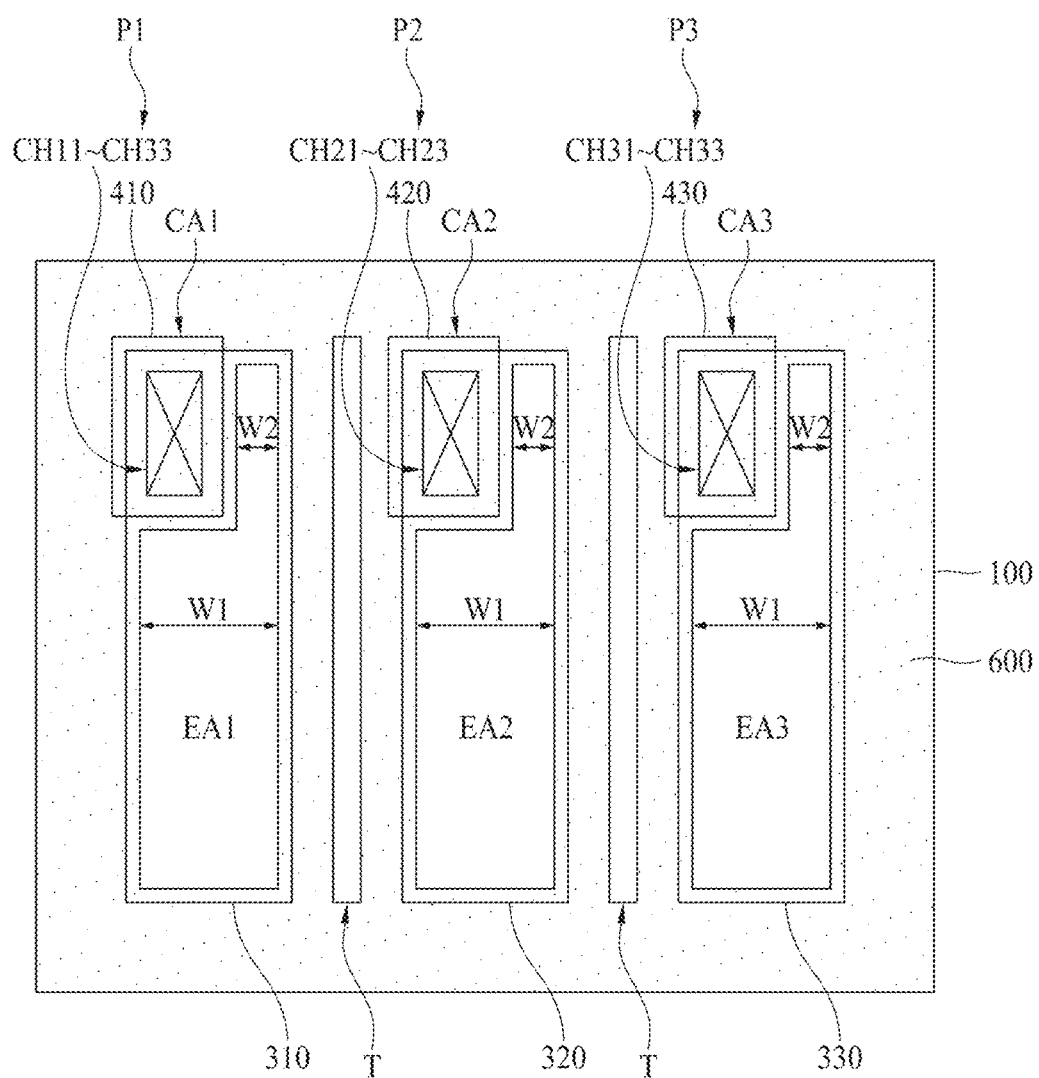
FIG. 18 is a plane view illustrating an electroluminescent display device according to an embodiment of the present disclosure.

FIG. 18 is a plane view of an electroluminescent display apparatus according to an embodiment of the present disclosure.

The electroluminescent display apparatus of FIG. 18 differs from the electroluminescent display apparatus of FIG. 11 in that a structure of each of a plurality of emission areas EA1 to EA3 and a plurality of contact areas CA1 to CA3 is modified. With reference to FIG. 11, only one side of the first contact area CA1 may face the first emission area EA1, only one side of the second contact area CA2 may face the second emission area EA2, and only one side of the third contact area CA3 may face the third emission area EA3. On the other hand, with reference to FIG. 18, two sides (for example, a lower side and a right side) of a first contact area CA1 may face a first emission area EA1, two sides (for example, a lower side and a right side) of a second contact area CA2 may face a second emission area EA2, and two sides (for example, a lower side and a right side) of a third contact area CA3 may face a third emission area EA3. Therefore, in FIG. 18, the first to third emission areas EA1 to EA3 may each include a first portion, which is disposed under the first to third contact areas CA1 to CA3 and has a first width W1, which is relatively wide, and a second portion, which is disposed to the right of the first to third contact areas CA1 to CA3 and has a second width W1 which is relatively narrow.

In FIG. 11, because the contact areas CA1 to CA3 are long provided in a widthwise direction on the emission areas EA1 to EA3, there is a limitation in reducing a widthwise-direction width of each of the contact areas CA1 to CA3, and even in a case in which the widthwise-direction width of each of the contact areas CA1 to CA3 is set to be less than a widthwise-direction width of each of the emission areas EA1 to EA3, because an empty space next to each of the contact areas CA1 to CA3 is small, it is difficult to form the emission areas EA1 to EA3 next to the contact areas CA1 to CA3. Due to this, even when the widthwise-direction width of each of the contact areas CA1 to CA3 is maximally reduced, it is difficult to increase a size of each of the emission areas EA1 to EA3.

On the other hand, in FIG. 18, because contact areas CA1 to CA3 are long provided, emission areas EA1 to EA3 may be formed to the right of the contact areas CA1 to CA3, and for example, when a lengthwise-direction width of each of the contact areas CA1 to CA3 is reduced, a size of each of the emission areas EA1 to EA3 may increase by a decrement, and an aperture ratio may be enhanced. In a first subpixel P1, an upper side and a left side of a first contact electrode 410 may be mismatched or may match with an upper side and a left side of a first electrode 310. Similarly, in a second subpixel P2, an upper side and a left side of a second contact electrode 420 may be mismatched or may match with an upper side and a left side of a first electrode 320, and in a third subpixel P3, an upper side and a left side of a third contact electrode 430 may be mismatched or may match with an upper side and a left side of a first electrode 330.

The contact areas (for example, first to third contact areas) CA1 to CA3 may be respectively disposed in right upper ends of the emission areas (for example, first to third emission areas) EA1 to EA3, and thus, a lower side and a left side of the first contact area CA1 may face the first emission area EA1, a lower side and a left side of the second contact area CA2 may face the second emission area EA2, and a lower side and a left side of the third contact area CA3 may face the third emission area EA3. A structure of each of the contact areas CA1 to CA3 and the emission areas EA1 to EA3 illustrated in FIG. 18 may be applied to the structure of various embodiments described above.

Figure 19:
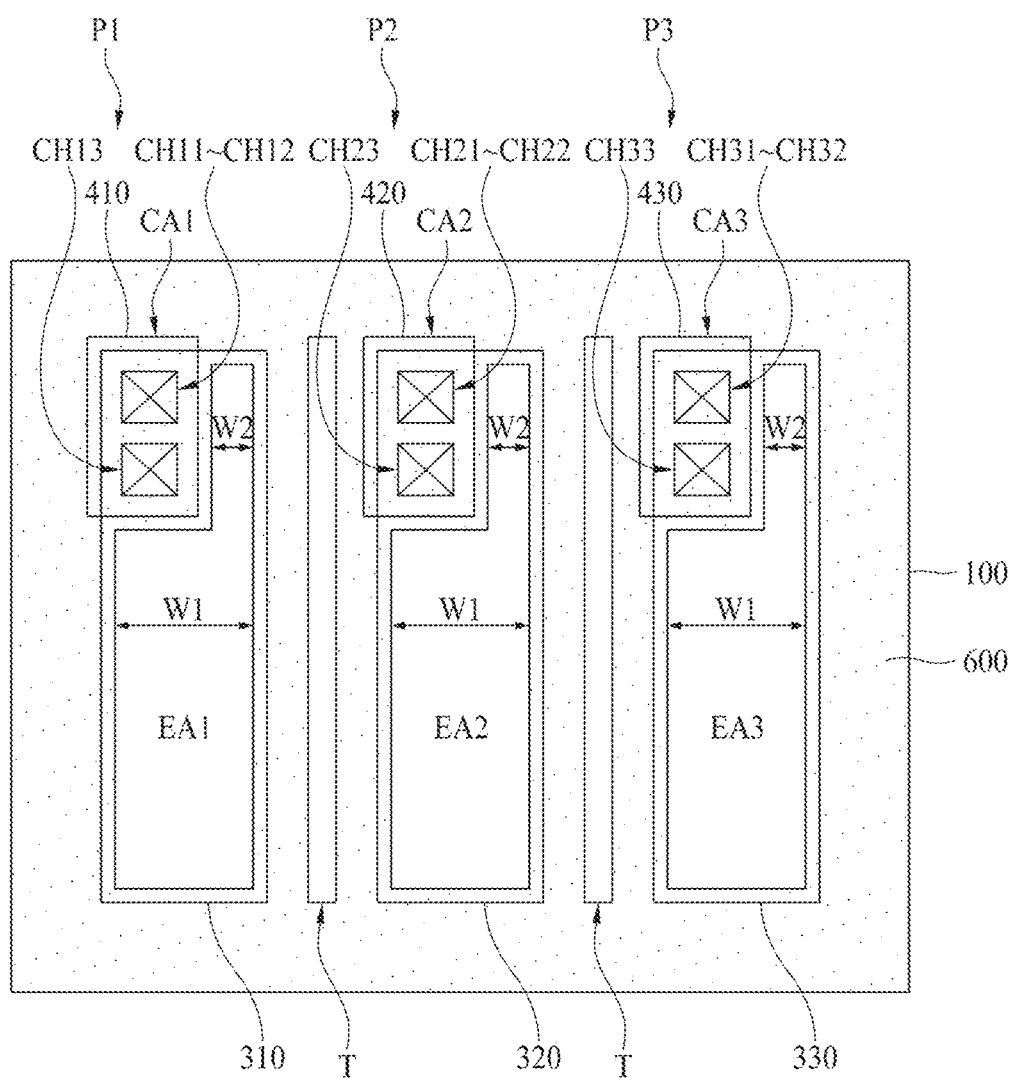
FIG. 19 is a plane view illustrating an electroluminescent display device according to an embodiment of the present disclosure.

FIG. 19 is a cross-sectional view of an electroluminescent display apparatus according to an embodiment of the present disclosure.

The electroluminescent display apparatus of FIG. 19 differs from the electroluminescent display apparatus of FIG. 18 in that a configuration of each of a plurality of contact holes CH11 to CH13, CH21 to CH23, and CH31 to CH33 is modified. With reference to FIG. 19, a first contact hole CH11 may overlap a second contact hole CH12, but may not overlap a third contact hole CH13 in a first subpixel P1; a first contact hole CH21 may overlap a second contact hole CH22, but may not overlap a third contact hole CH23 in a second subpixel P2; and a first contact hole CH31 may overlap a second contact hole CH32, but may not overlap a third contact hole CH33 in a third subpixel P3. Although not shown, the first contact hole CH11 may overlap the third contact hole CH13, but may not overlap the second contact hole CH12 in the first subpixel P1; the first contact hole CH21 may overlap the third contact hole CH23, but may not overlap the second contact hole CH22 in the second subpixel P2; and the first contact hole CH31 may overlap the third contact hole CH33, but may not overlap the second contact hole CH32 in the third subpixel P3. Moreover, all of the first contact hole CH11, the second contact hole CH12, and the third contact hole CH13 may not overlap in the first subpixel P1; all of the first contact hole CH21, the second contact hole CH22, and the third contact hole CH23 may not overlap in the second subpixel P2; and all of the first contact hole CH31, the second contact hole CH32, and the third contact hole CH33 may not overlap in the third subpixel P3. Comparing with a case in which all of the first contact holes CH11, CH21, and CH31, the second contact holes CH12, CH22, and CH32, and the third contact holes CH13, CH23, and CH33 overlap, when at least one contact hole does not overlap the other contact holes, a process of forming the contact holes CH11 to CH13, CH21 to CH23, and CH31 to CH33 may be easily performed and a size of each of the contact holes CH11 to CH13, CH21 to CH23, and CH31 to CH33 may be reduced.

According to an embodiment of the present disclosure, the trench may be provided in the boundary between the neighboring subpixels, and at least some of the emission layer may be noncontiguous (e.g., disconnectedly provided) in the trench area. Thus, it may be possible to reduce or prevent a leakage current between the neighboring subpixels, to reduce or prevent a problem related to deterioration of picture quality.

Also, according to an embodiment of the present disclosure, a first distance between the first lower electrode and the first upper electrode in the first subpixel, a second distance between the second lower electrode and the second upper electrode in the second subpixel, and a third distance between the third lower electrode and the third upper electrode in the third subpixel may be different so that it may be possible to obtain a micro-cavity effect in each subpixel, to improve light efficiency. For example, according to an embodiment of the present disclosure, a first contact electrode may be in the first subpixel, a second contact electrode may be in the second subpixel, and a third contact electrode may be in the third subpixel so that it may be possible to simply adjust the first to third distances by the first to third contact electrodes with ease.

Figure 20A:
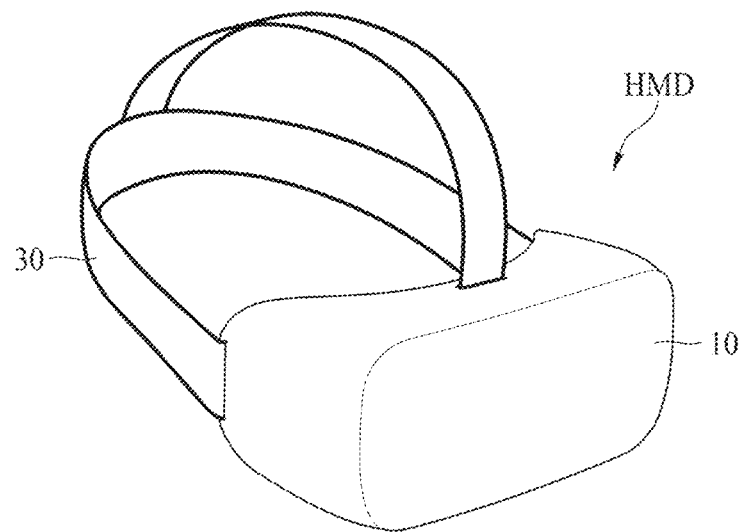
FIGS. 20A to 20C illustrate examples of an electroluminescent display device according to an embodiment of the present disclosure.
Figure 20B:
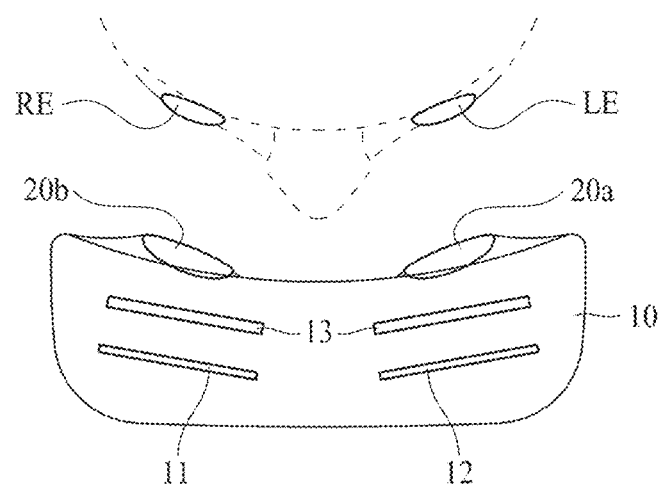
Figure 20C:
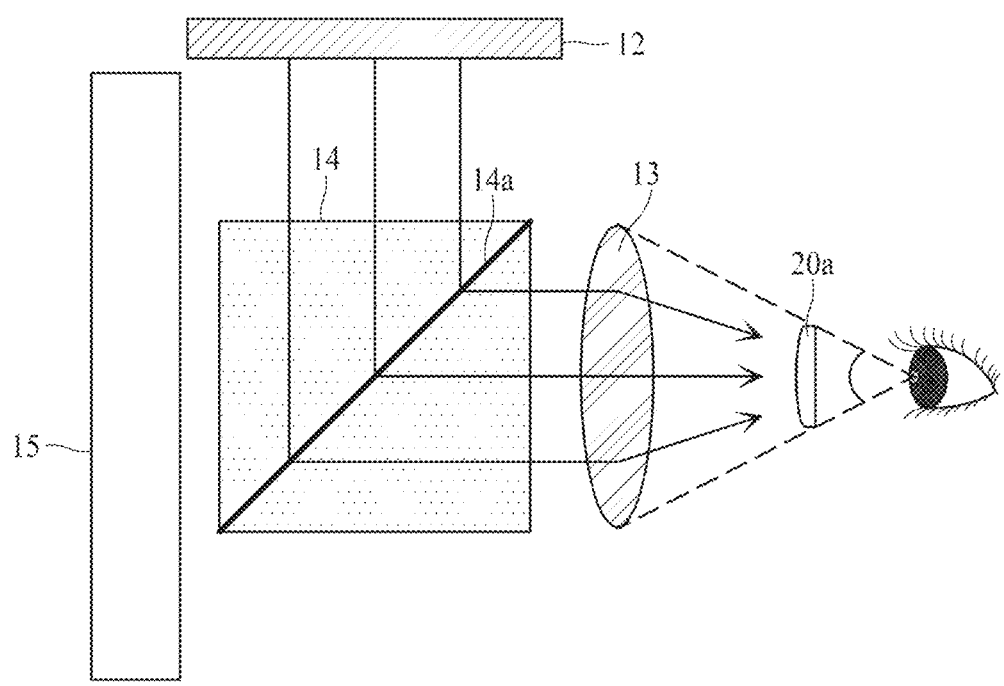

FIGS. 20A to 20C illustrate examples of an electroluminescent display device according to an embodiment of the present disclosure, which relate with a head-mounted display (HMD) device.

FIG. 20A is a schematic perspective view, FIG. 20B is a plane view of a virtual reality (VR) structure, and FIG. 20C is a cross-sectional view of an augmented reality (AR) structure. As shown in FIG. 20A, the head-mounted display (HMD) device according to an embodiment of the present disclosure may include a receiving case 10 and a head-mounted band 30.

A display device, a lens array, and an ocular eyepiece may be received (e.g., may be accommodated) in the inside of the receiving case 10. The head-mounted band 30 may be fixed to the receiving case 10. In the drawings, the head-mounted band 30 is illustrated as being configured to surround an upper surface and both lateral surfaces in a user's head, but embodiments are not limited to this structure. For example, the head-mounted band may be provided to fix the head-mounted display (HMD) device to a user's head, which may be substituted, e.g., by an eyeglass-frame shape or a helmet-shaped structure.

As shown in FIG. 20B, the head-mounted display (HMD) device of the virtual reality (VR) structure according to an embodiment of the present disclosure may include a left-eye display device 12, a right-eye display device 11, a lens array 13, a left-eye ocular eyepiece 20a, and a right-eye ocular eyepiece 20b. The left-eye display device 12, the right-eye display device 11, the lens array 13, and the left-eye ocular eyepiece 20a, and the right-eye ocular eyepiece 20b may be received in the receiving case 10.

The same image may be displayed on the left-eye display device 12 and the right-eye display device 11. For example, a user can watch a two-dimensional (2D) image. If an image for a left eye were displayed on the left-eye display device 12, and an image for a right eye were displayed on the right-eye display device 11, a user can watch a three-dimensional (3D) image. Each of the left-eye display device 12 and the right-eye display device 11 may include the display device shown in any of the examples of FIGS. 1 to 19. For example, an upper portion corresponding to a surface for displaying an image in any of the examples of FIGS. 1 to 19, e.g., the color filter layer 910, 920, and 930, may confront or face the lens array 13.

The lens array 13 may be between the left-eye ocular eyepiece 20a and the left-eye display device 12, while being spaced apart from each of the left-eye ocular eyepiece 20a and the left-eye display device 12. For example, the lens array 13 may be positioned at the front of the left-eye ocular eyepiece 20a and at the rear of the left-eye display device 12. Also, the lens array 13 may be between the right-eye ocular eyepiece 20b and the right-eye display device 11, while being apart from each of the right-eye ocular eyepiece 20b and the right-eye display device 11. For example, the lens array 13 may be positioned at the front of the right-eye ocular eyepiece 20b and at the rear of the right-eye display device 11.

The lens array 13 may be a micro lens array. The lens array 13 may be substituted by a pin hole array. Due to the lens array 13, an image displayed on the left-eye display device 12 or the right-eye display device 11 may be expanded and perceived by a user. A user's left eye (LE) may be positioned at the left-eye ocular eyepiece 20a, and a user's right eye (RE) may be positioned at the right-eye ocular eyepiece 20b.

As shown in FIG. 20C, the head-mounted display (HMD) device of the augmented reality (AR) structure according to an embodiment of the present disclosure may include a left-eye display device 12, a lens array 13, a left-eye ocular eyepiece 20a, a transmissive reflecting portion 14, and a transmission window 15. For convenience of explanation, FIG. 20C illustrates only the left-eye structure. The right-eye structure may be substantially similar in structure to the left-eye structure, as should be understood to one of ordinary skill in the art.

The left-eye display device 12, the lens array 13, the left-eye ocular eyepiece 20a, the transmissive reflecting portion 14, and the transmission window 15 may be received (e.g., may be accommodated) in the receiving case 10. The left-eye display device 12 may be disposed at one side of the transmissive reflecting portion 14, for example, an upper side of the transmissive reflecting portion 14, without covering the transmission window 15. Accordingly, an image may be provided to the transmissive reflecting portion 14, under the condition that an ambient background seen through the transmission window 15 may not be covered by the left-eye display device 12.

The left-eye display device 12 may include the display device shown in any of the examples of FIGS. 1 to 19. For example, an upper portion corresponding to a surface for displaying an image in any of the examples of FIGS. 1 to 19, e.g., the color filter layer 910, 920, and 930, may confront the transmissive reflecting portion 14.

The lens array 13 may be provided between the left-eye ocular eyepiece 20a and the transmissive reflecting portion 14. A user's left eye may be positioned at the left-eye ocular eyepiece 20a.

The transmissive reflecting portion 14 may be between the lens array 13 and the transmission window 15. The transmissive reflecting portion 14 may include a reflection surface 14a, which may partially transmit some light, and may also reflect the remaining light. The reflection surface 14a may be configured to guide an image, which may be displayed on the left-eye display device 12, toward the lens array 13. Thus, a user can watch an image displayed on the left-eye display device 12 together with the ambient background through the transmission window 15. For example, a user can watch one image obtained by a virtual image overlaid with the ambient real background, e.g., to realize an augmented reality (AR). The transmission window 15 may be disposed in front of the transmissive reflecting portion 14.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An electroluminescent display device, comprising:
  a substrate comprising:
    a first subpixel; and
    a second subpixel;
  a respective first electrode in each of the first subpixel and the second subpixel on the substrate;
  a trench in a boundary between the first subpixel and the second subpixel on the substrate;

an emission layer on the first electrode, and in the first subpixel, the second subpixel, and the boundary between the first subpixel and the second subpixel, a first portion of the emission layer being noncontiguous in the trench, a second portion of the emission layer being contiguous between the first subpixel and the second subpixel;
a pore below the emission layer inside the trench, an upper end of the pore being relatively higher than at least some of the emission layer; and
a second electrode on the emission layer.

2. The electroluminescent display device of claim 1, wherein:
the emission layer comprises:
a first stack configured to emit first-colored light;
a second stack configured to emit second-colored light; and
a charge generation layer between the first stack and the second stack;
the first stack and the charge generation layer are each noncontiguous inside the trench; and
the upper end of the pore is relatively higher than the charge generation layer.

3. The electroluminescent display device of claim 2, wherein:
the second stack is connected between the first subpixel and the second subpixel; and
a thickness of the second stack in an area of the trench in which the charge generation layer is noncontagious is relatively smaller than a thickness of the second stack in an area that does not overlap the trench.

4. The electroluminescent display device of claim 2, wherein:
the first stack comprises:
a first portion on one lateral surface inside the trench;
a second portion on another lateral surface inside the trench; and
a third portion on an inner lower surface inside the trench; and
the first portion of the first stack, the second portion of the first stack, and the third portion of the first stack are noncontiguous with one another.

5. The electroluminescent display device of claim 4, wherein:
the charge generation layer comprises:
a first portion on the first portion of the first stack;
a second portion on the second portion of the second stack; and
a third portion on the third portion of the first stack; and
the first portion of the charge generation layer, the second portion of the charge generation layer, and the third portion of the charge generation layer are noncontiguous with one another.

6. The electroluminescent display device of claim 2, wherein:
one of the first stack and the second stack comprises a blue (B)-emitting layer; and
the other of the first stack and the second stack comprises:
a red emitting layer; and
a yellow-green or green emitting layer.

7. The electroluminescent display device of claim 1, wherein:
a depth of the trench is within a range of 0.2 µm to 0.4 µm; and
a width of the trench is within a range of 0.1 µm to 0.2 µm.

8. The electroluminescent display device of claim 1, further comprising:
a bank surrounding the periphery of the first electrode; and
an insulating layer below the bank,
wherein the bank is in contact with the trench, and
wherein the trench is in the bank and the insulating layer.

9. The electroluminescent display device of claim 1, further comprising:
a bank surrounding the periphery of the first electrode; and
an insulating layer below the bank,
wherein the bank is not in direct contact with the trench, and
wherein the trench is in the insulating layer.

10. The electroluminescent display device of claim 1, wherein:
the trench has a shape corresponding to a shape of the first subpixel and the second subpixel; and
the trench surrounds an entire periphery of the first subpixel and the second subpixel.

11. The electroluminescent display device of claim 1, wherein:
the first subpixel and the second subpixel are arranged along a horizontal direction;
an arrangement structure, comprising the first subpixel and the second subpixel arranged in the horizontal direction, is repetitively provided to provide a plurality of rows along a vertical direction crossing the horizontal direction; and
the trench has a contiguous straight-line structure along the vertical direction.

12. The electroluminescent display device of claim 1, further comprising:
a lens array spaced apart from the substrate; and
a receiving case configured to accommodate the substrate and the lens array therein.

13. An electroluminescent display device, comprising:
a substrate comprising:
a first subpixel;
a second subpixel; and
a third subpixel;
a circuit device layer comprising a driving thin-film transistor respectively in each of the first, second, and third subpixels;
a respective first electrode in each of the first, second, and third subpixels on the circuit device layer;
a trench in respective boundaries between each of the first to third subpixels on the substrate;
an emission layer on the first electrode, and in the first to third subpixels and the respective boundaries between each of the first to third subpixels, a first portion of the emission layer being noncontiguous in the trench, a second portion of the emission layer being contiguous between the first to third subpixels;
a pore below the emission layer inside the trench, an upper end of the pore being relatively higher than at least some of the emission layer; and
a second electrode on the emission layer,
wherein the first electrode in the first subpixel comprises:
a first lower electrode, and
a first upper electrode,
wherein the first electrode in the second subpixel comprises:
a second lower electrode, and
a second upper electrode, and
wherein the first electrode in the third subpixel comprises:
a third lower electrode, and
a third upper electrode, wherein a distance between the first lower electrode and the first upper electrode, a distance between the second lower electrode and the second upper electrode, and a distance between the third lower electrode and the third upper electrode are different from one another.

14. The electroluminescent display device of claim 13, further comprising:
a first contact electrode between the first lower electrode and the first upper electrode, the first contact electrode being configured to electrically connect the first lower electrode to the first upper electrode, the first contact electrode comprising:
a first lower contact electrode; and
a first upper contact electrode,
wherein the first lower contact electrode is between the first lower electrode and the first upper contact electrode, the first lower contact being configured to electrically connect the first lower electrode to the first upper contact electrode,
wherein the first upper contact electrode is between the first lower contact electrode and the first upper electrode, the first upper contact electrode being configured to electrically connect the first lower contact electrode to the first upper electrode, and
wherein the first lower electrode is electrically connected to the driving thin-film transistor of the first subpixel through a contact hole in the circuit device layer.

15. The electroluminescent display device of claim 13, wherein:
the second lower electrode is electrically connected to the second upper electrode and the driving thin-film transistor of the second subpixel through a second contact electrode;
the second contact electrode comprises:
a second lower contact electrode; and
a second upper contact electrode;
the second lower contact electrode is between the second lower electrode and the driving thin-film transistor of the second subpixel, the second lower contact electrode being configured to electrically connect the second lower electrode to the driving thin-film transistor of the second subpixel; and
the second upper contact electrode is between the second lower contact electrode and the second upper electrode, the second upper contact electrode being configured to electrically connect the second lower contact electrode to the second upper electrode.

16. The electroluminescent display device of claim 13, further comprising:
a first contact electrode between the first lower electrode and the first upper electrode, the first lower electrode being electrically connected to the first upper electrode through the first contact electrode, the first contact electrode comprising a single contact layer,
wherein the first lower electrode is electrically connected to the driving thin-film transistor of the first subpixel through a contact hole in the circuit device layer, and
wherein first and second insulating layers are between the first lower electrode and the first contact electrode.

17. The electroluminescent display device of claim 13, further comprising:
a second contact electrode between the second upper electrode and the driving thin-film transistor of the second subpixel, the second upper electrode being electrically connected to the driving thin-film transistor of the second subpixel through the second contact electrode,
wherein the second contact electrode comprises:
a second lower contact electrode, and
a second upper contact electrode,
wherein the second lower contact electrode is between the second upper contact electrode and the driving thin-film transistor of the second subpixel, the second lower contact electrode being configured to electrically connect the second upper contact electrode to the driving thin-film transistor of the second subpixel,
wherein the second upper contact electrode is between the second lower contact electrode and the second upper electrode, the second upper contact electrode being configured to electrically connect the second lower contact electrode to the second upper electrode, and
wherein first and second insulating layers are between the second lower contact electrode and the second upper contact electrode.

18. The electroluminescent display device of claim 17, wherein the second lower electrode is not electrically connected to the second upper electrode and the second contact electrode.

19. The electroluminescent display device of claim 17, wherein the second lower electrode is directly connected to a lateral surface of the second upper contact electrode.

20. The electroluminescent display device of claim 13, wherein:
a number of insulating layers between the second lower electrode and the second upper electrode is smaller than a number of insulating layers between the first lower electrode and the first upper electrode; and
the number of insulating layers between the second lower electrode and the second upper electrode is larger than a number of insulating layers between the third lower electrode and the third upper electrode.

21. The electroluminescent display device of claim 13, wherein:
the first lower electrode and the first upper electrode are electrically connected to each other through a plurality of contact holes, and at least one of the plurality of contact holes is provided not to overlap the other contact holes.

22. The electroluminescent display device of claim 13, wherein:
the first sub pixel comprises a first emission area and a first contact area,
two sides of the first contact area face the first emission area, and the first emission area comprises a first portion, having a first width which is relatively wide, and a second portion having a second width which is relatively narrow.

* * * * *